(12) United States Patent
Dal et al.

(10) Patent No.: US 9,368,604 B1
(45) Date of Patent: Jun. 14, 2016

(54) METHOD OF REMOVING THREADING DISLOCATION DEFECT FROM A FIN FEATURE OF III-V GROUP SEMICONDUCTOR MATERIAL

(71) Applicant: Taiwan Semiconductor Manufacturing Company, Ltd., Hsin-Chu (TW)

(72) Inventors: Mark van Dal, Belgium (DE); Georgios Vellianitis, Belgium (DE); Matthias Passlack, Belgium (DE); Martin Christopher Holland, Belgium (DE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/659,060

(22) Filed: Mar. 16, 2015

(51) Int. Cl.
| | |
|---|---|
| *H01L 29/66* | (2006.01) |
| *H01L 21/306* | (2006.01) |
| *H01L 21/324* | (2006.01) |
| *H01L 21/02* | (2006.01) |
| *H01L 29/32* | (2006.01) |
| *H01L 21/762* | (2006.01) |

(52) U.S. Cl.
CPC .... *H01L 29/66795* (2013.01); *H01L 21/02381* (2013.01); *H01L 21/02455* (2013.01); *H01L 21/02507* (2013.01); *H01L 21/30612* (2013.01); *H01L 21/3247* (2013.01); *H01L 21/76224* (2013.01); *H01L 29/32* (2013.01); *H01L 29/66545* (2013.01)

(58) Field of Classification Search
CPC ............... H01L 29/66795; H01L 21/02455; H01L 21/02507; H01L 29/32
See application file for complete search history.

(56) References Cited

U.S. PATENT DOCUMENTS

| | | | |
|---|---|---|---|
| 8,455,929 B2 | 6/2013 | Ko et al. | |
| 2013/0099283 A1 | 4/2013 | Lin et al. | |

OTHER PUBLICATIONS

M. K. Hudait et al., "Heterogeneous Integration of Enhancement Mode $IN_{0.7}Ga_{0.3}As$ Quantum Well Transistor on Silicon Substrate using Thin ($\le 2$ μm) Composite Buffer Architecture for High-Speed and Low-Voltage (0.5V) Logic Applications," Electron Devices Meeting, 2007, IEDM 2007 IEEE International, Dec. 10-12, 2007, pp. 625-628, Washington, D.C.

*Primary Examiner* — Amar Movva
(74) *Attorney, Agent, or Firm* — Haynes and Boone, LLP

(57) ABSTRACT

The present disclosure provides a method of forming a fin-like field-effect transistor (FinFET) device. The method includes forming a first strain-relaxed buffer (SRB) stack over a substrate. The first SRB stack has a lattice mismatch with respect to the substrate that generates a threading dislocation defect feature in the first SRB stack. The method also includes forming a patterned dielectric layer over the first SRB stack. The patterned dielectric layer includes a trench extending therethrough. The method also includes forming a second SRB stack over the first SRB stack and within the trench. The second SRB stack has a lattice mismatch with respect to the substrate such that an upper portion of the second SRB stack is without threading dislocation defects.

20 Claims, 28 Drawing Sheets

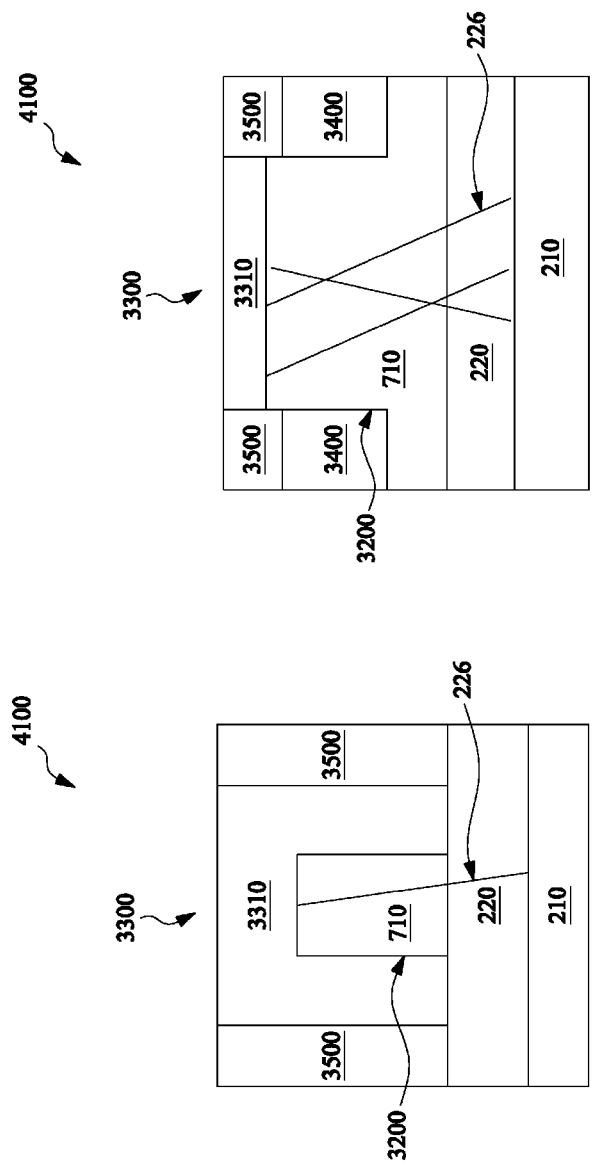

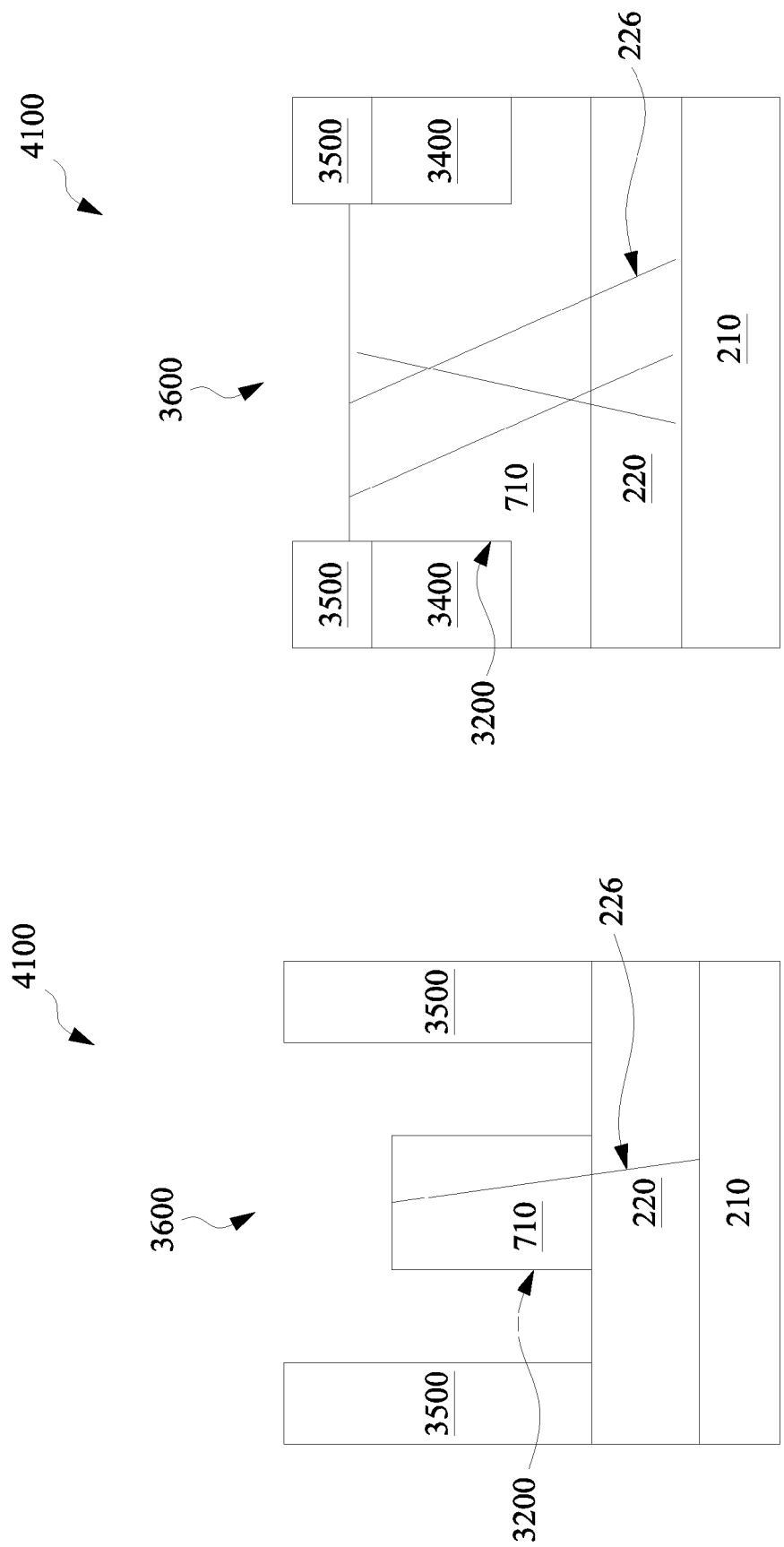

US 9,368,604 B1

METHOD OF REMOVING THREADING DISLOCATION DEFECT FROM A FIN FEATURE OF III-V GROUP SEMICONDUCTOR MATERIAL

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed. For example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been generally adequate, they have not proved entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 17B, 18A, 19A, 20A and 21A are cross-sectional views of an example semiconductor device in accordance with some embodiments, along the line A-A in FIG. 17A.

FIGS. 17C, 18B, 19B, 20B and 21B are cross-sectional views of an example semiconductor device in accordance with some embodiments, along the line B-B in FIG. 17A.

DETAILED DESCRIPTION

Figure 1:
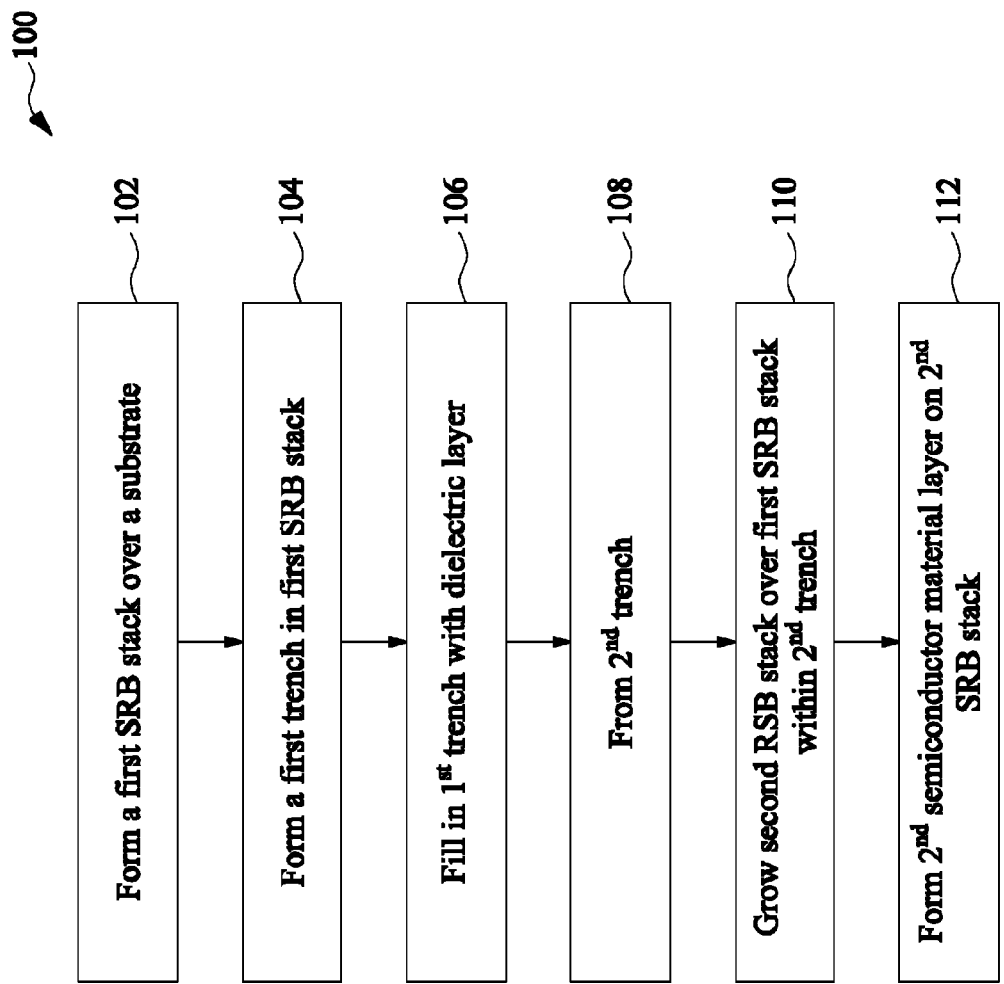
FIG. 1 is a flow chart of an example method for fabricating a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2:
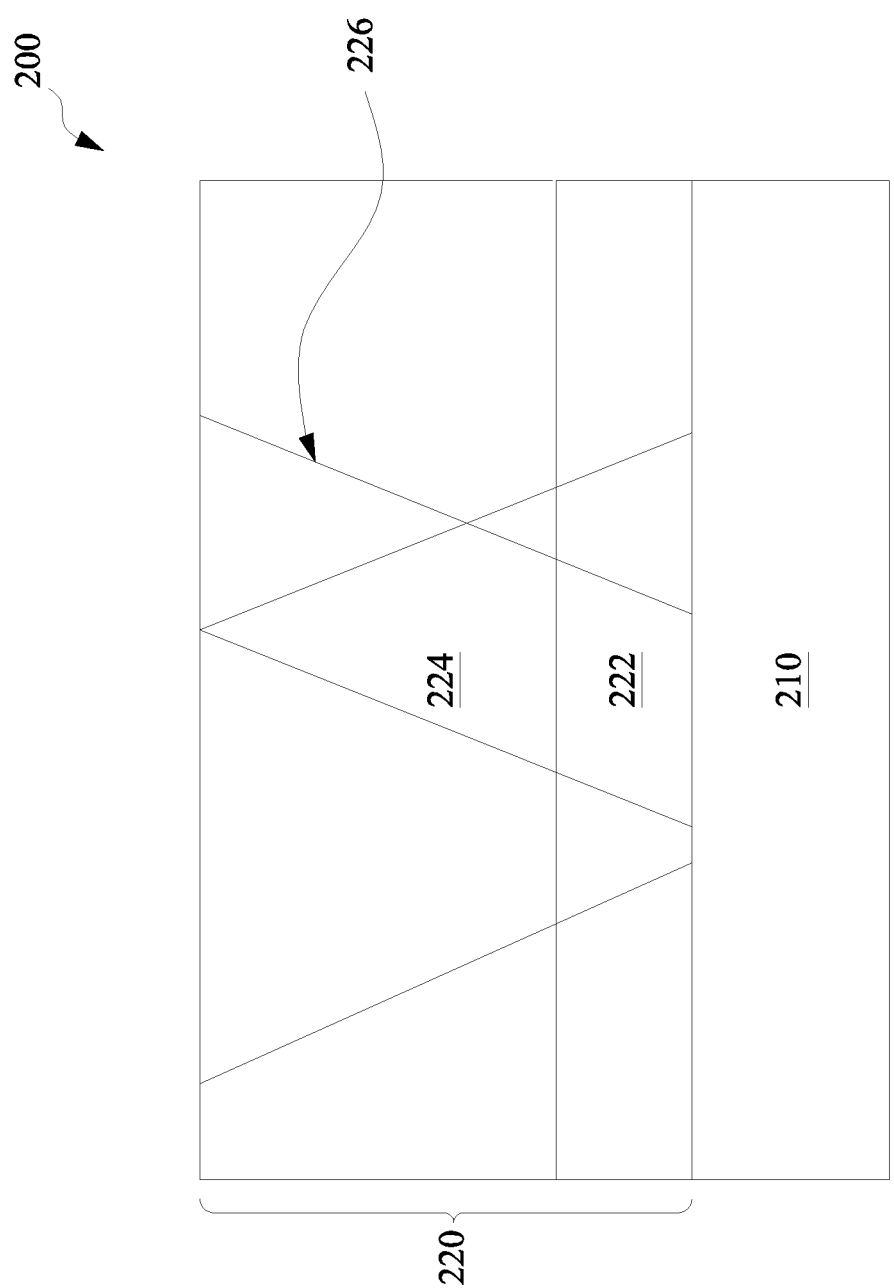
FIGS. 2 to 8A-8C are cross-sectional views of an example semiconductor device at fabrication stages constructed according to the method of FIG. 1.

Referring to FIGS. 1 and 2, the method 100 begins at step 102 by forming a first strain-relaxed-buffer (SRB) 220 over a substrate 210. The substrate 210 may include a first semiconductor material selected from the group consisting of silicon, silicon germanium, silicon germanium carbide, germanium, silicon phosphoric and combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

The substrate 210 may include various doped features depending on design requirements as known in the art. In some embodiment, the substrate 210 may include various doped regions depending on design requirements (e.g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

In the present embodiment, a second semiconductor material layer is designed to be formed over the substrate 210 and various features and regions, such as fin feature and channel region, will be formed by the second semiconductor material layer. In the present embodiment, the second semiconductor material layer is different from the first semiconductor material of the substrate 210 with lattice constant mismatch for strained effect and enhanced mobility. In some embodiments, the first semiconductor material of the substrate 210 includes silicon and the second semiconductor material layer includes III-V group compound semiconductor in order to integrate III-V group compound semiconductor active regions on a silicon substrate for high performance (high speed or high frequency) devices using mature silicon fabrication technology. Due to the large lattice mismatch of the second semiconductor material layer (such as III-V group compound semiconductor) and the first semiconductor material (such as Si) it is challenging to grow low-defective second semiconductor material layer over the substrate 210.

In the present embodiment, prior to forming the second semiconductor material layer over the substrate 210, the first SRB stack 220 is formed over the substrate 210. The first SRB stack 220 includes a material/materials having different lattice constant than the substrate 210 but having similar lattice constants with respect to the second semiconductor material. In some embodiments, the first SRB stack 220 includes III-V group compound semiconductor materials while the first semiconductor material of the substrate 210 includes silicon. In some embodiment, the first SRB stack 220 includes a SRB layer 222 to provide an effective filter for threading dislocation defects and a first buffer layer 224 to enhance electric insulation for the second semiconductor layer to be formed over the substrate 210.

The SRB layer 222 may include heterogeneous epitaxially grown composite layer or layers, where the concentration of the elements such that lattice constant is gradually changed and thereby the lattice mismatch is gradually changed from the first semiconductor material layer of the substrate 210 towards the designed second semiconductor material layer. The SRB layer 222 may include indium aluminum arsenide (InAlAs), indium phosphide (InP), aluminum gallium arsenide (AlGaAs), gallium arsenide (GaAs), gallium arsenide phosphide (GaAsP), indium gallium antimony (InGaSb), and/or other suitable materials. In some embodiments, the SRB layer 222 physically contacts the substrate 210. An example of a method of forming SRB layer is described in the article by Hudait et al, *Heterogeneous Integration of Enhancement Mode $In_{0.7}Ga_{0.3}As$ Quantum Well Transistor on Silicon Substrate using Thin (≤2 µm) Composite Buffer Architecture for High-Speed and Low-voltage (0.5V) Logic Application*, Electron Devices Meeting, 2007. IEDM 2007. IEEE International, Dec. 10, 2007, at 625, which is incorporated by reference herein in its entirety.

The first buffer layer 224 is formed over the SRB layer 222. In the present embodiment, a material of the first buffer layer 224 is chosen to have a band-gap larger than the SRB layer 222 for electric insulation enhancement. Materials for the first buffer layer 224 having a large band-gap include InAlAs, InP, GaAs, and/or other suitable materials. The first SRB stack 220 may be formed by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

Referring again to FIG. 2, in the present embodiment, the materials of the first SRB stack 220 has different lattice constants than the first semiconductor material of the substrate 210. Accordingly, there is mismatch between the substrate 210 and the first SRB stack 220 at their interface, which causes defects 226 generated in the first SRB stack 220. In the present case, the defects 226 may include threading dislocation defects, point defects and antiphase boundaries, which are located at the interface between the substrate 210 and the first SRB stack 220 and are extended upward. In some embodiments, even though the SRB layer 222 is an effective filter for threading dislocation defects, a further reducing defect density is needed. The present disclosure provides methods to reduce/remove defects 226 in the first SRB stack 220, especially at its upper portion (e.g. first buffer layer 224), where the second semiconductor material layer will be formed over.

Figure 3:
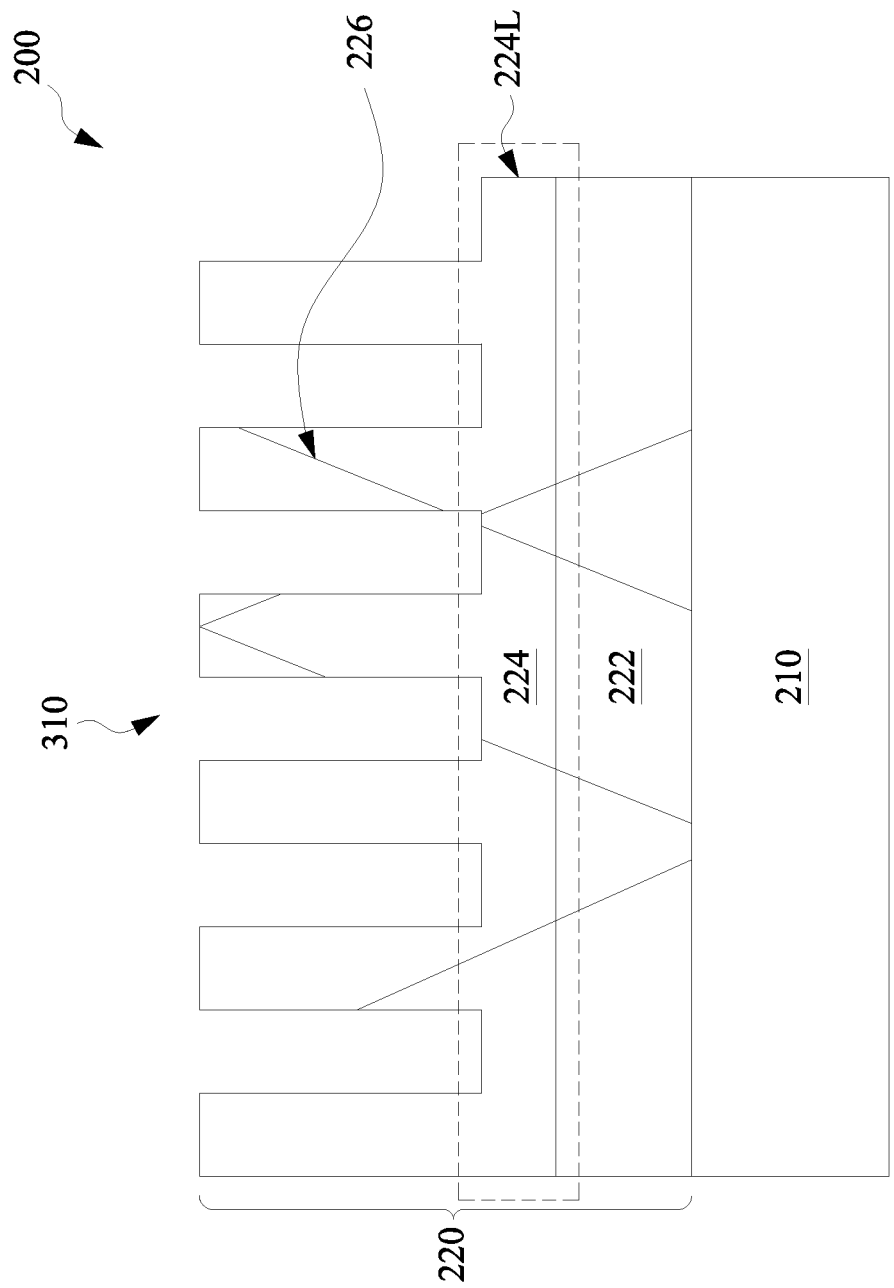

Referring to FIGS. 1 and 3, the method 100 proceeds to step 104 by forming first trenches 310 in the first SRB stack 220. As an example, in order to form the first trenches 310, a patterned photoresist layer is formed over the first SRB stack 220 and the first SRB stack 220 is etched through the patterned photoresist layer. The etching process may include a wet etch or a dry etch. In one embodiment, the wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the first trenches 310 are formed in the first buffer layer 224 and a depth of etching process is controlled that a lower portion 224L of the first buffer layer 224 remains.

Figure 4:
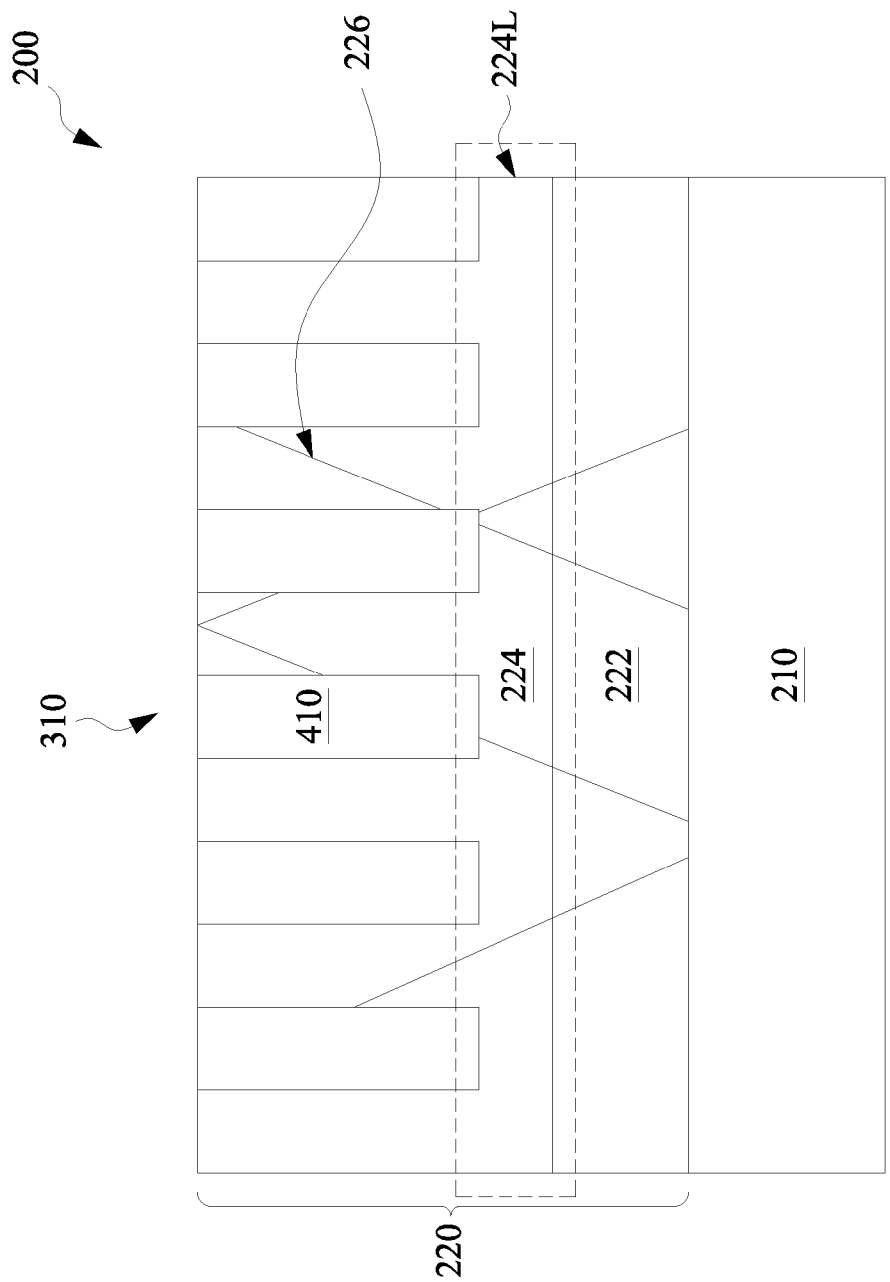

Referring to FIGS. 1 and 4, the method 100 proceeds to step 106 by filling in the first trenches 310 with a dielectric layer 410. The dielectric layer 410 may include silicon oxide, silicon nitride, silicon oxynitride, spin-on-glass, spin-on-polymer, and/or other suitable materials, and/or combinations thereof. The dielectric layer 410 may be deposited by CVD, PVD, ALD, thermal oxidation, spin-on coating, or other suitable techniques, and/or a combination thereof. A chemical mechanical polishing (CMP) process may be performed thereafter to remove excessive the dielectric layer 410.

Figure 5:
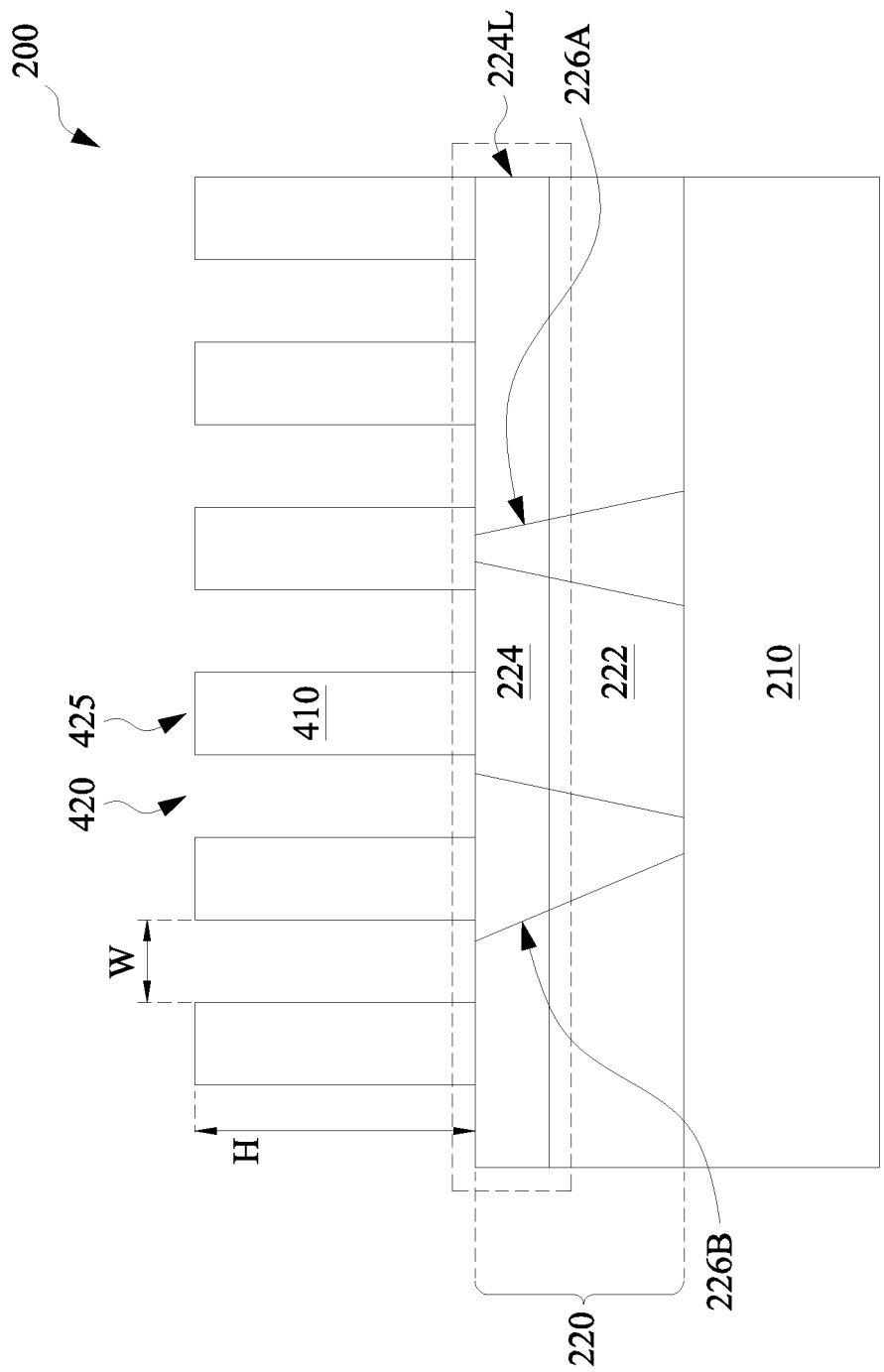

Referring also to FIGS. 1 and 5, the method 100 proceeds to step 108 by forming second trenches 420 over the first SRB stack 220 such that the dielectric layer 410 serves as trench walls 425 of the second trenches 420. In some embodiment, the second trenches 420 are formed by recessing an upper portion of the first buffer layer 224 while remaining the lower portion 224L. The etch process may be properly chosen to selectively etch the first buffer layer 224 without substantially etching the dielectric layer 410. The second trench 420 has dimensions including width W and height H as illustrated in FIG. 5. The aspect ratio of the second trench 420 is defined as H/W is greater than 1.4.

In the present embodiment, after forming the second trench 420, some of the defects 226 end underneath respective trench walls 425, referred to as 226A, while some of the defects 226 are at bottoms of the respective second trenches 420, referred to as 226B.

Referring to FIGS. 1 and 6A-6C the method 100 proceeds to step 110 by growing a second SRB stack 500 over the first SRB stack 220 within the second trench 420. The second SRB stack 500 includes a material/materials having similar lattice constant as the first SRB stack 220, therefore a generation of a mismatch defect is prevented. In some embodiments, the second SRB stack 500 includes III-V group compound semiconductor materials. In the present embodiment, the material/or materials of the second SRB stack 500 is chosen to have a band-gap similar to the first buffer layer 224 for electric insulation enhancement. The second SRB stack 500 may be formed by CVD, VPE, UHV-CVD, molecular beam epitaxy, and/or other suitable processes.

Figure 6A:
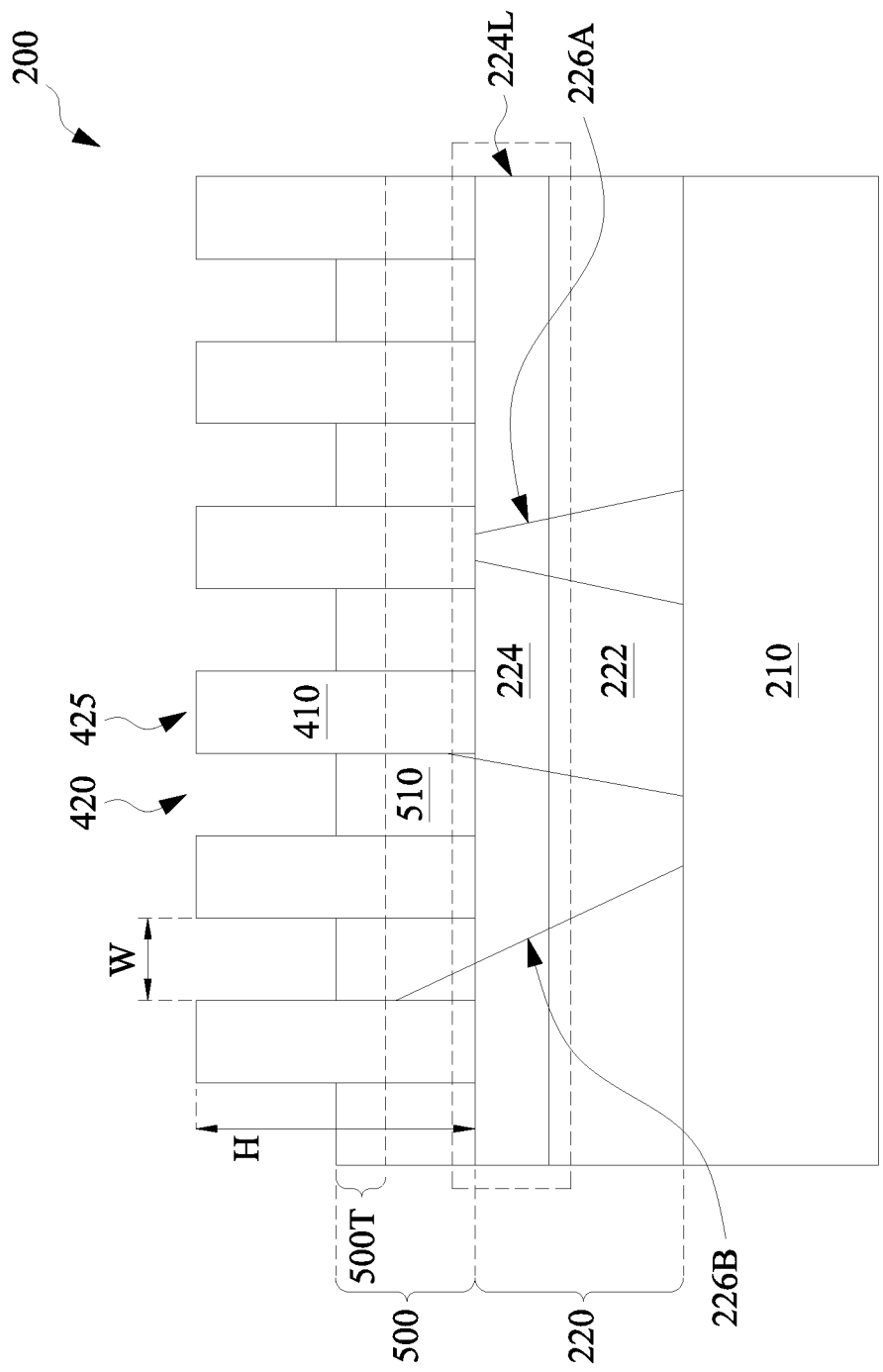

In some embodiments at step 110, the second SRB stack 500 includes a second buffer layer 510 (as shown in FIG. 6A). In one embodiment, the second buffer layer 510 is composed of the same material as the first buffer layer 224. In the present embodiment, as the second trenches 420 have certain aspect ratio H/W, such that the defects 226B are trapped at a lower portions of the second SRB stack 500 by the trench sidewall 425 and leaving the top portions 500T of the second SRB stack 500 defect free. In one embodiment, the second trench 420 is designed such that the aspect ratio H/W is greater than 1.4.

Figure 6B:
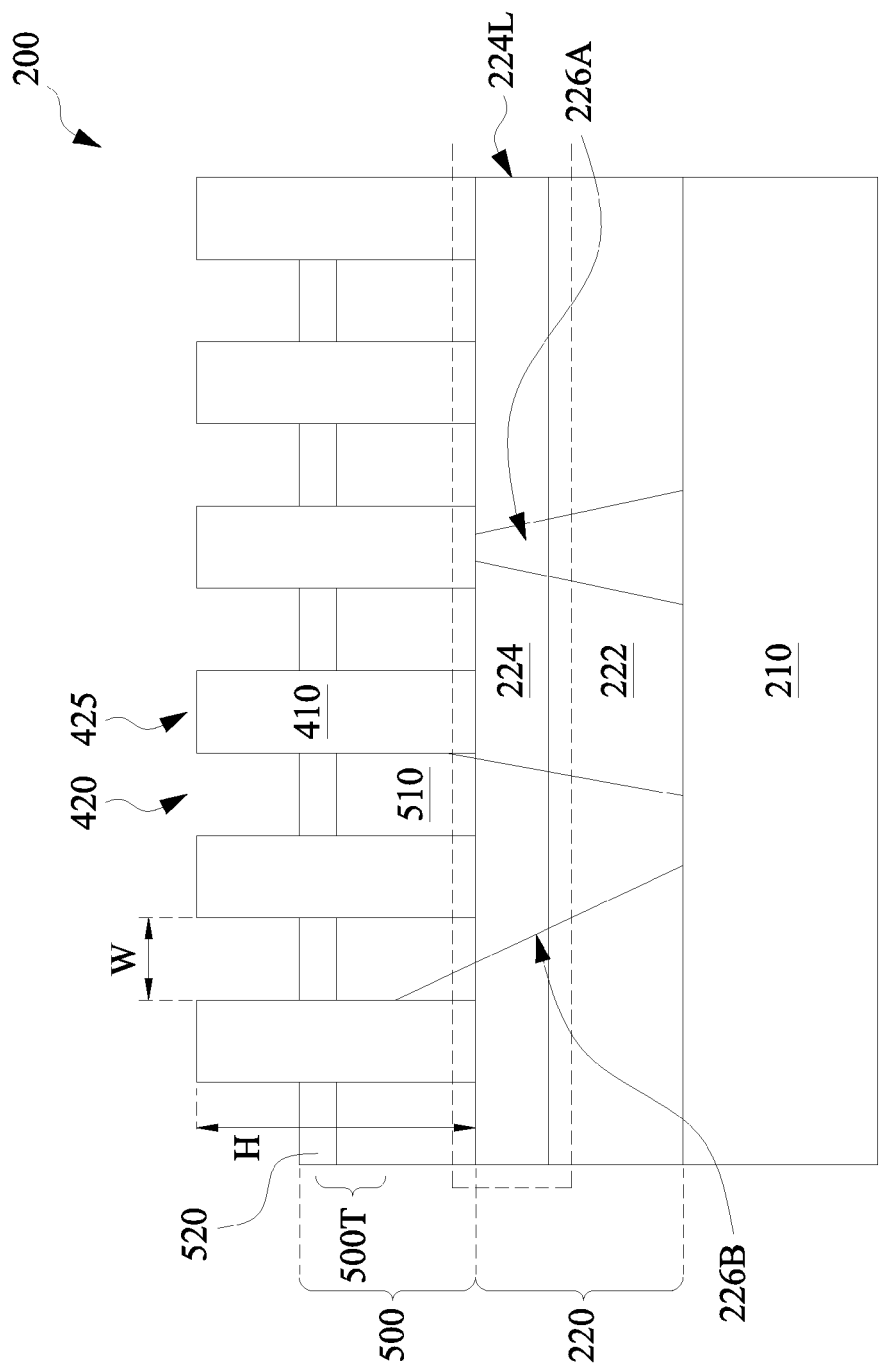

In an alternative embodiments at step 110, the second SRB stack 500 includes the second buffer layer 510 formed over the first SRB stack 220 and a thin strained-layer-superlattice (SLS) layer 520 formed over the second buffer layer 510 in the second trench 420 (as shown in FIG. 6B), which induces strain to bend the defects 226 to not extend upward. The SLS layer 520 may include multiple of thin layers of different materials expitaxially grown on top of each other, without generating of mismatch defects. In some embodiments, a thickness of the SLS layer 520 is in a range of about 0.5 nm to about 10 nm. The SLS layer 520 has a lattice mismatch with second buffer layer 510 in a range of about 0.5% to about 4%. A material/or materials of the SLS layer 520 is chosen to have a large band-gap for electric insulation enhancement and it may include InAlAs, GaAs, AlGaAs, AlAsSb AlGaSb, or other suitable material. A ratio of group III element to group V element may be tuned such that a desired trade-off between insulation and strain is achieved. In the present embodiment, with a proper aspect ratio H/W of the second trench 420 and the SLS layer 520, the defects 226B are trapped at a lower portions of the second SRB stack 500 and leaving the top portions 500T of the second SRB stack 500 defect free.

Figure 6C:
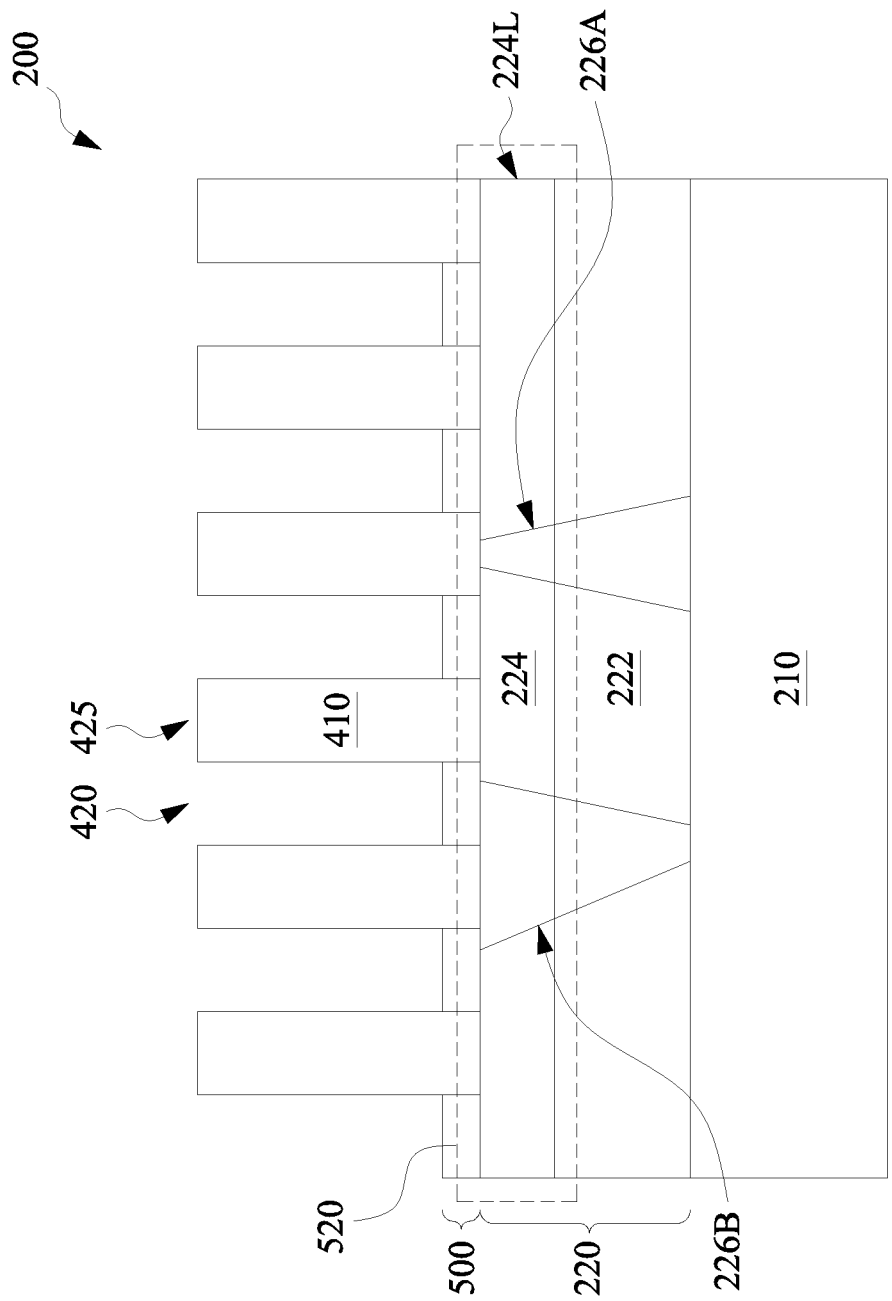
Figure 7A:
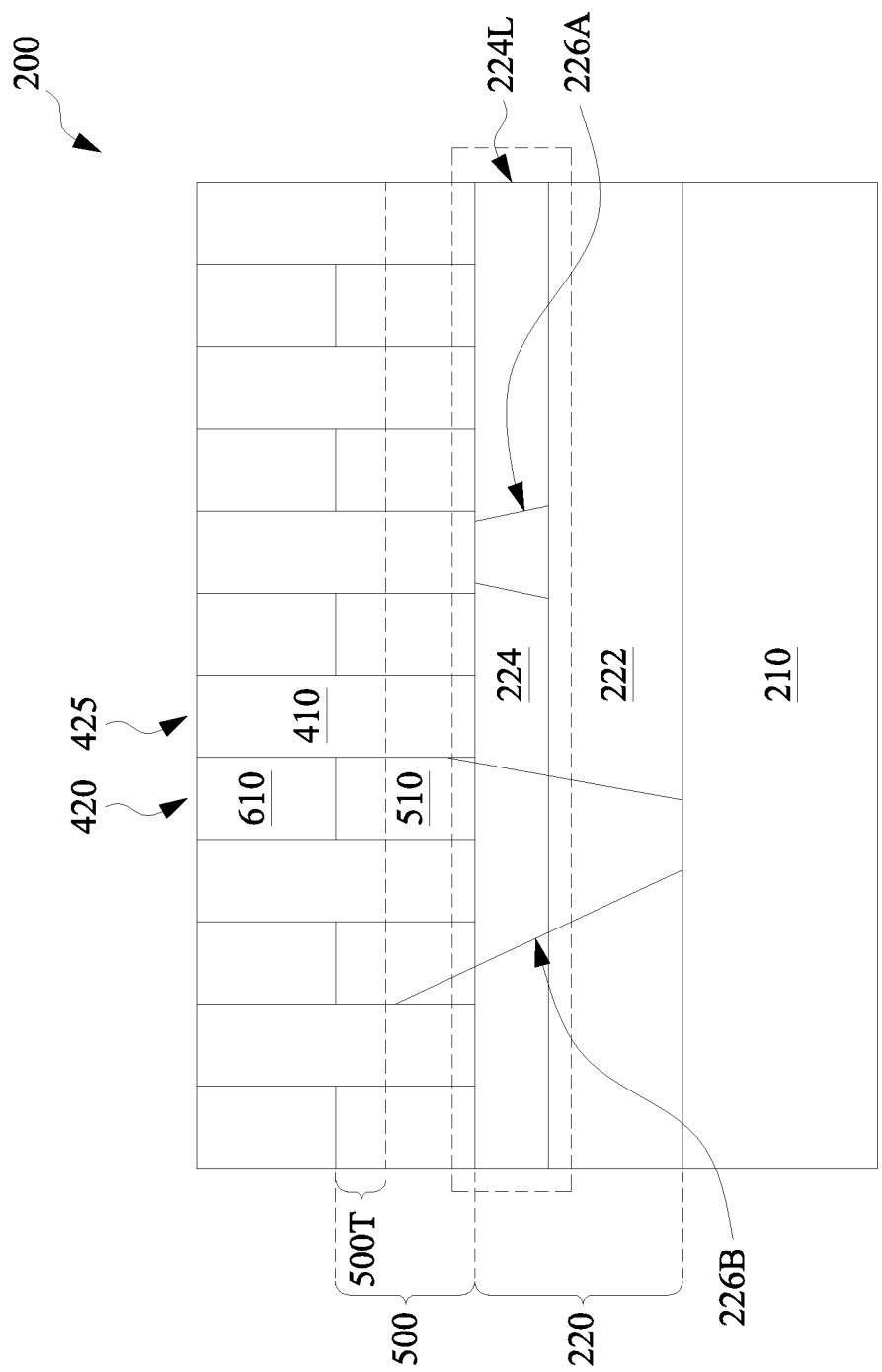
Figure 7B:
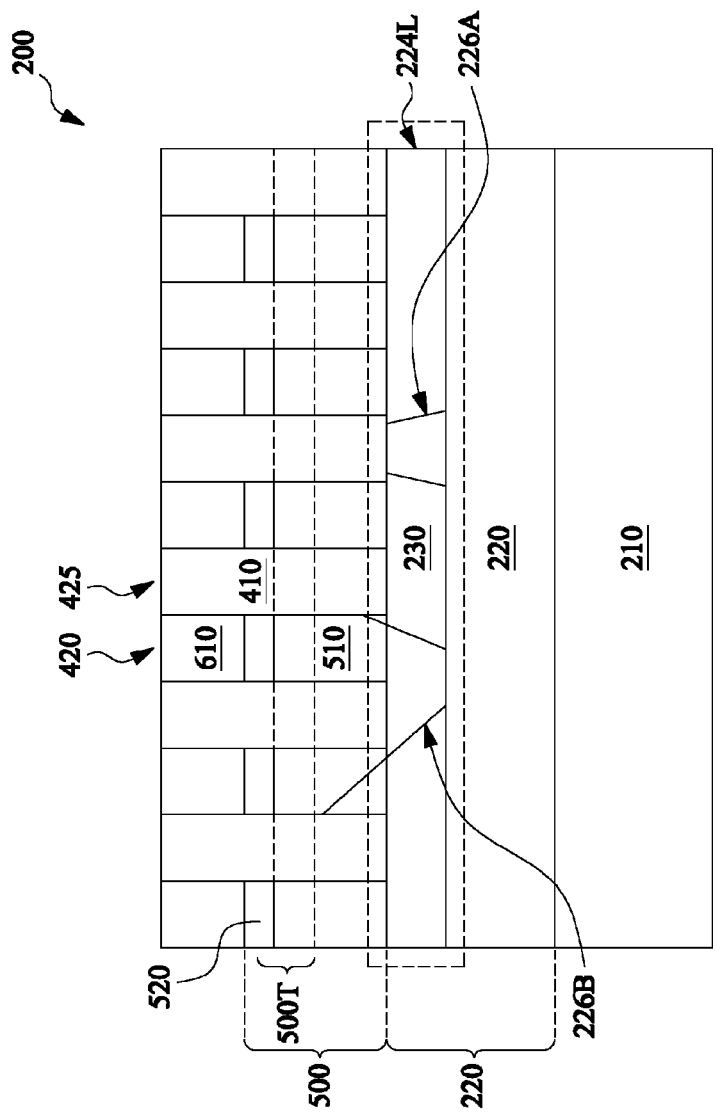
Figure 7C:
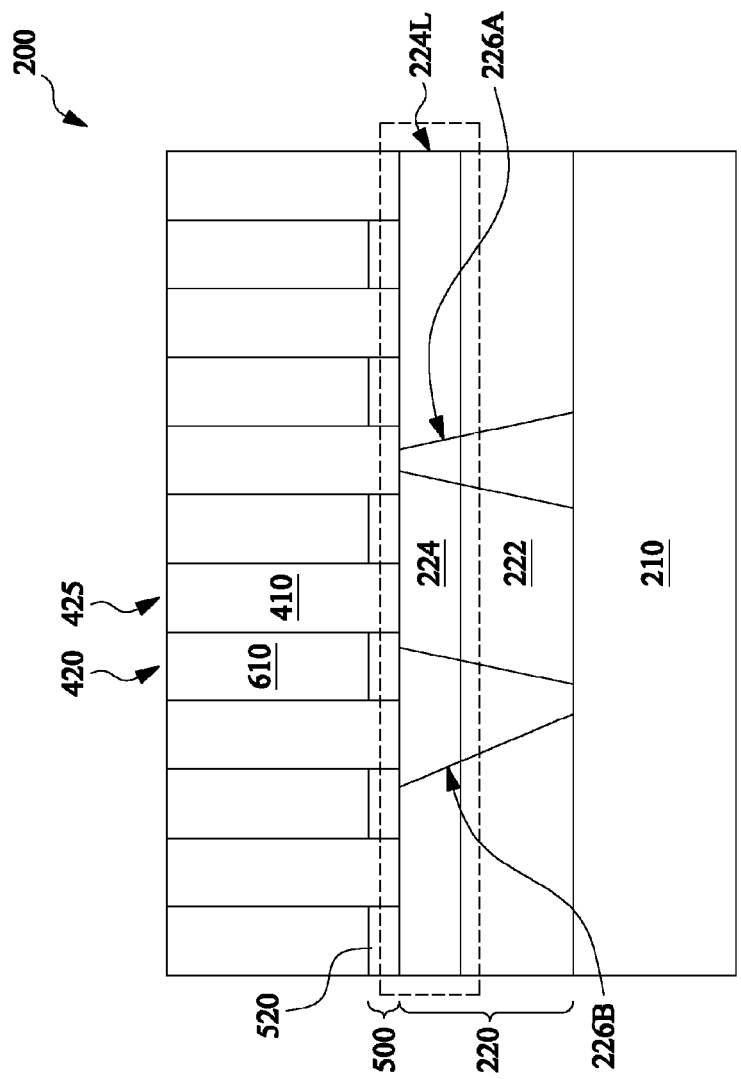

In yet further alternative embodiments at step 110, the second SRB stack 500 includes the SLS layer 520 (as shown in FIG. 6C). With a proper strain induced by the SLS layer 520, the defects 226B are trapped (bended) at the first SRB stack 220 and leaving the second SRB stack 550 defect free.

Referring to FIGS. 1 and 7A-7C (in conjunction with the embodiments and processes described above with respect to FIGS. 6A-6C), the method 100 proceeds to step 112 by forming the second semiconductor material layer 610 over the second SRB stack 550. The second semiconductor material layer 610 physically contacts the top portion 550T of the second SRB stack 500, where the defects 226B are free. The second semiconductor material layer 610 has a lattice constant closely matching with the second SRB stack 550 to avoid generation of mismatch defect. The second semiconductor material layer 610 includes III-V group compound semiconductor, such as InAs, InGaAs, GaSb, InSb, or other suitable material. The second semiconductor material layer 610 may be deposited by epitaxial growth. The epitaxial process may include CVD deposition techniques, molecular beam epitaxy, and/or other suitable processes. A CMP process may be performed thereafter to remove excessive the second semiconductor material layer 610.

Figure 8A:
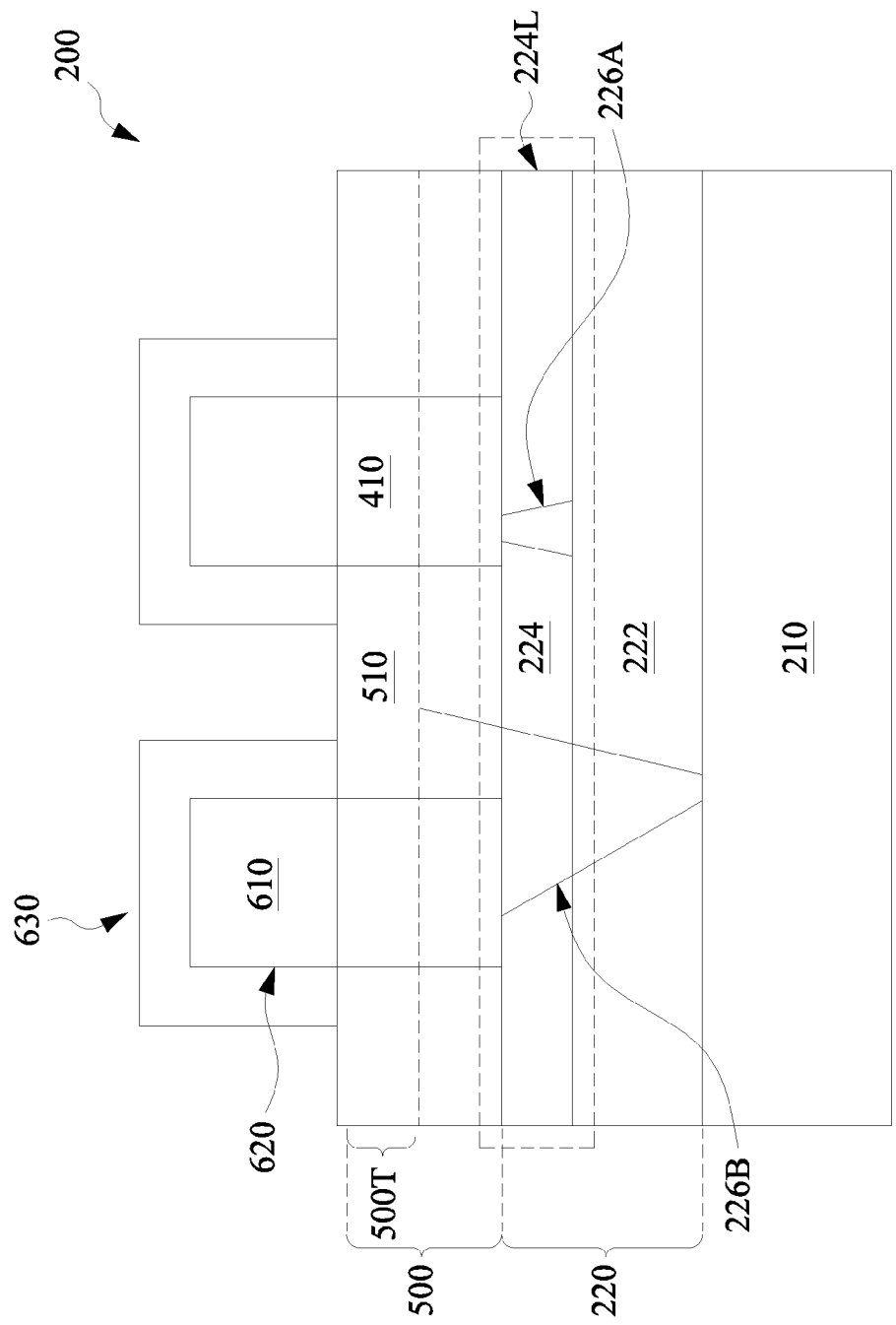
Figure 8B:
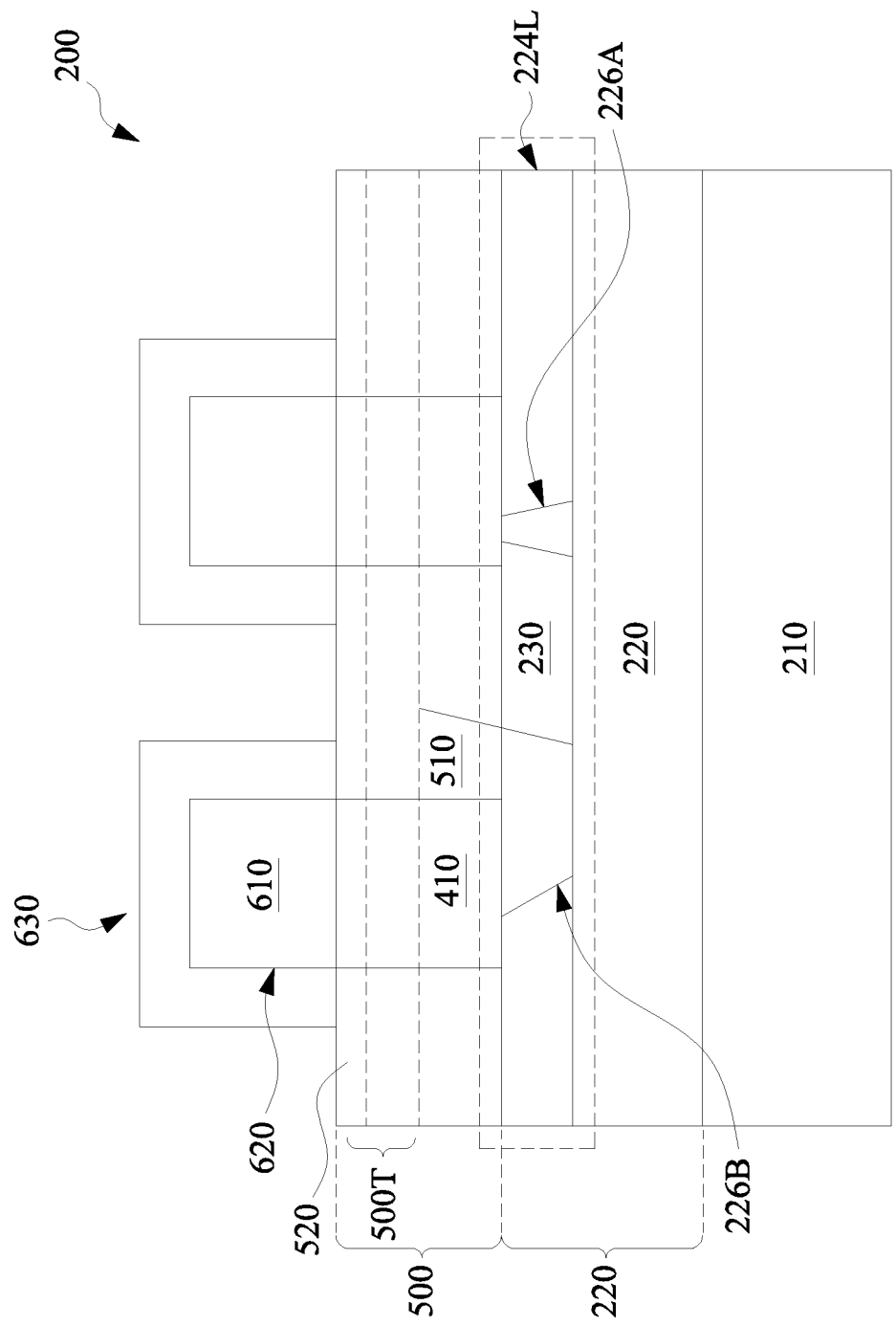
Figure 8C:
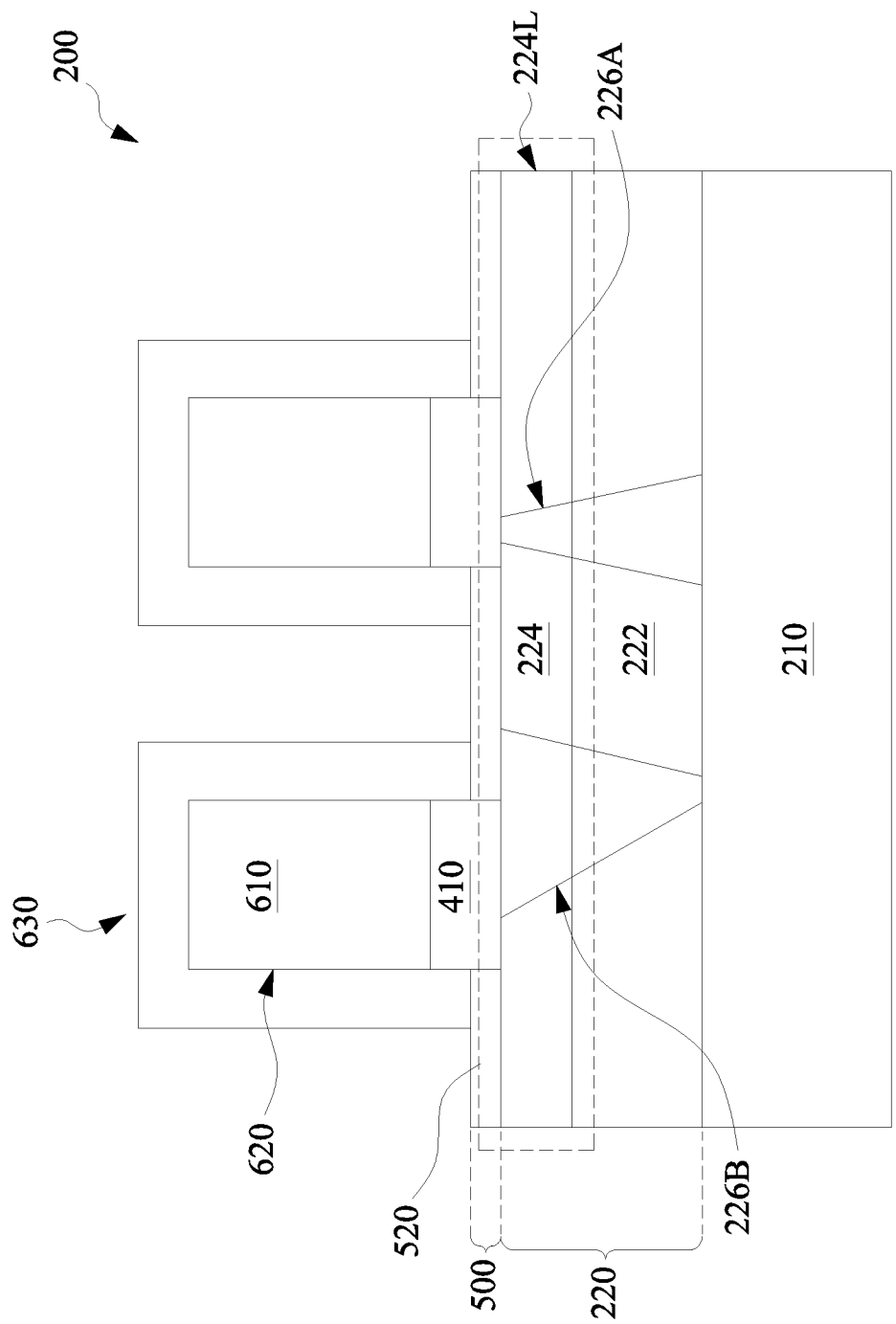

Various active regions may be formed by respective portions of the second semiconductor material layer 610, such as a gate and source/drain features. For example, as shown in FIG. 8A-8C (in conjunction with the embodiments and processes described above with respect to FIGS. 7A-7C), a fin feature 620 is formed by the second semiconductor material layer 610, a gate 630 stack is formed over the substrate 210, including wrapping over a portion of the fins feature 620. As mentioned previously, the second semiconductor material layer 610 is different from the first semiconductor material of the substrate 210 with lattice constant mismatch for strained effect and enhanced mobility. In the meantime, the second SRB stack 500, as well as the first buffer layer 224 in the first SRB stack 220, provides adequate electric insulation for these active regions and features.

Additional steps can be provided before, during, and after the methods of 100 and some of the steps described can be replaced, eliminated, or moved around for additional embodiments of the method of 100. Other alternatives or embodiments may present without departure from the spirit and scope of the present disclosure.

Figure 9:
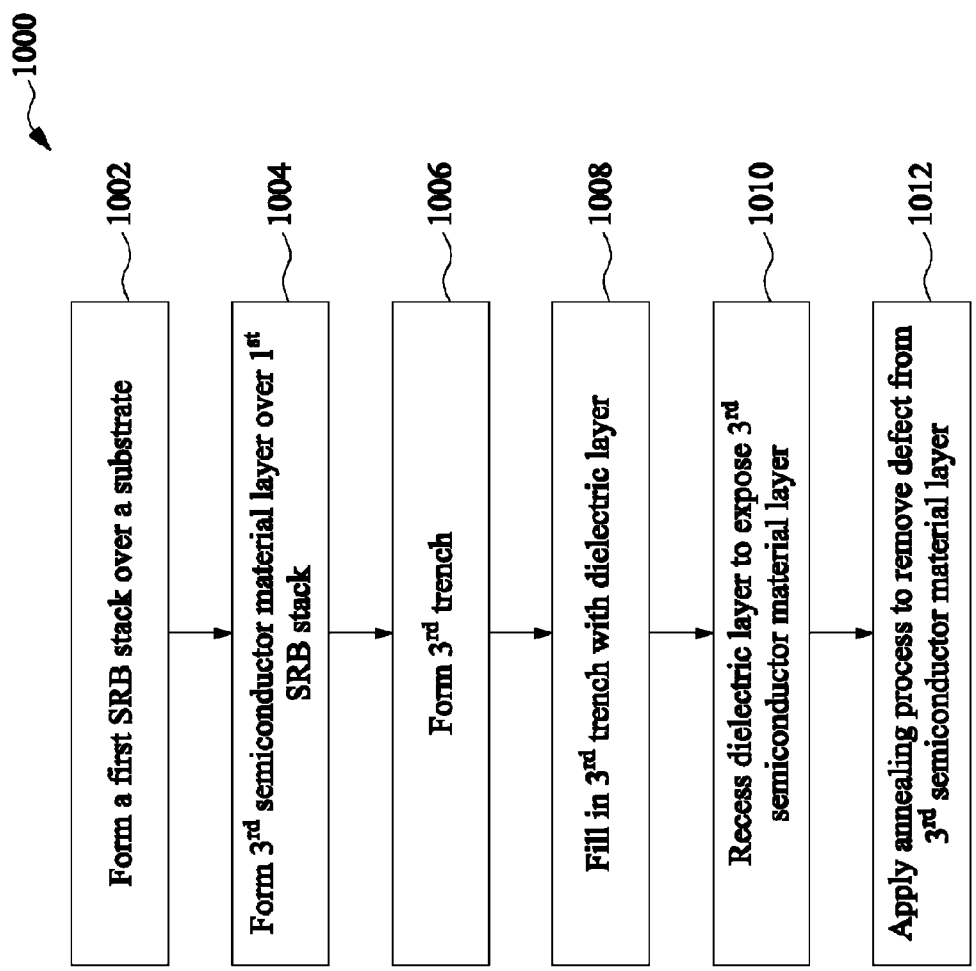
FIG. 9 is a flow chart of another example method for fabricating a semiconductor device in accordance with some embodiments.

FIG. 9 is a flowchart of another example method 1000 for fabricating a semiconductor device 1500. The first step 1002 is similar to those discussed above with respect to step 102 of the method 100. Thus, the discussion above with respect to step 102 is applicable to step 1002. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 10:
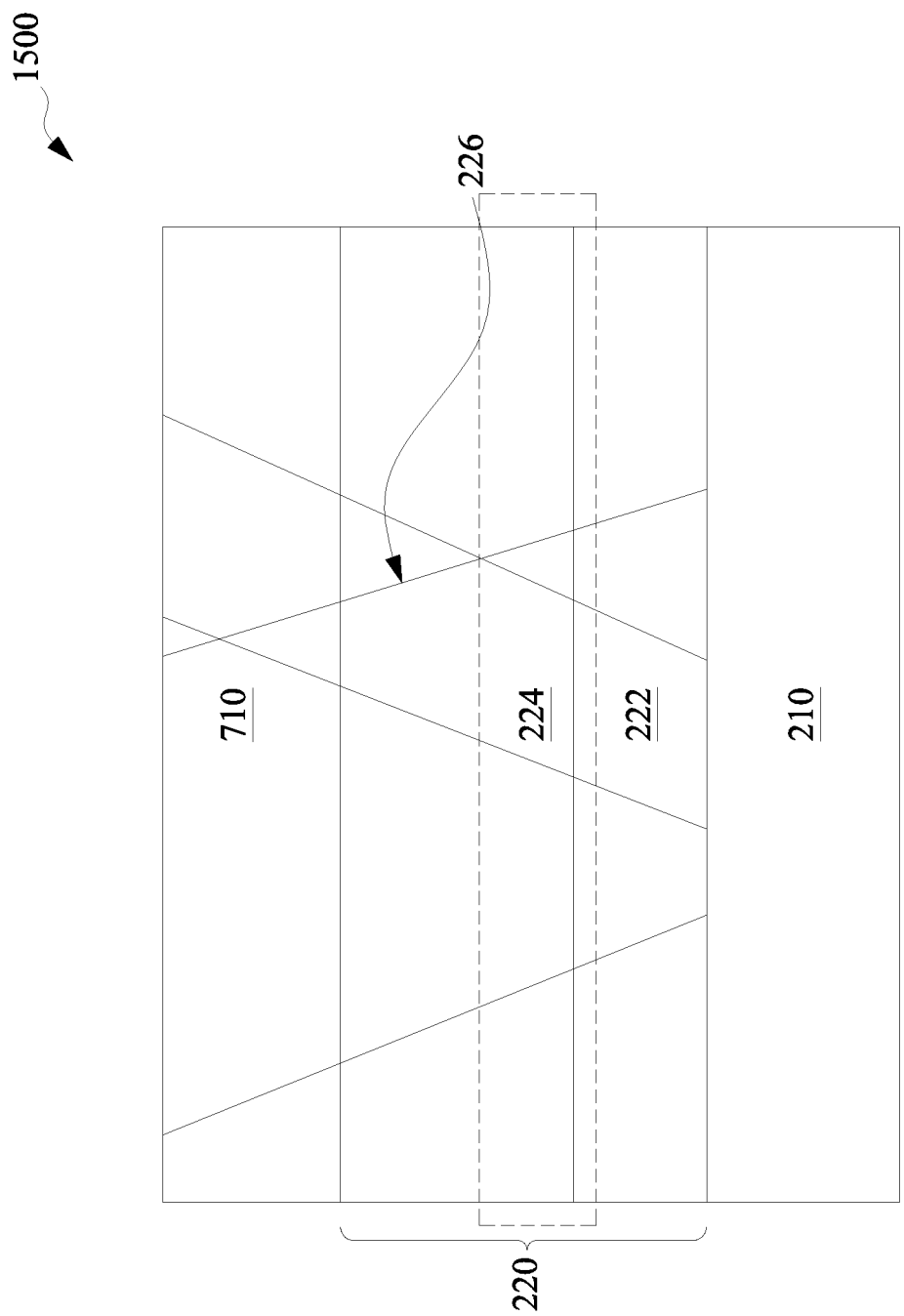
FIGS. 10 to 15 are cross-sectional views of an example semiconductor device at fabrication stages constructed according to the method of FIG. 9.
Figure 11:
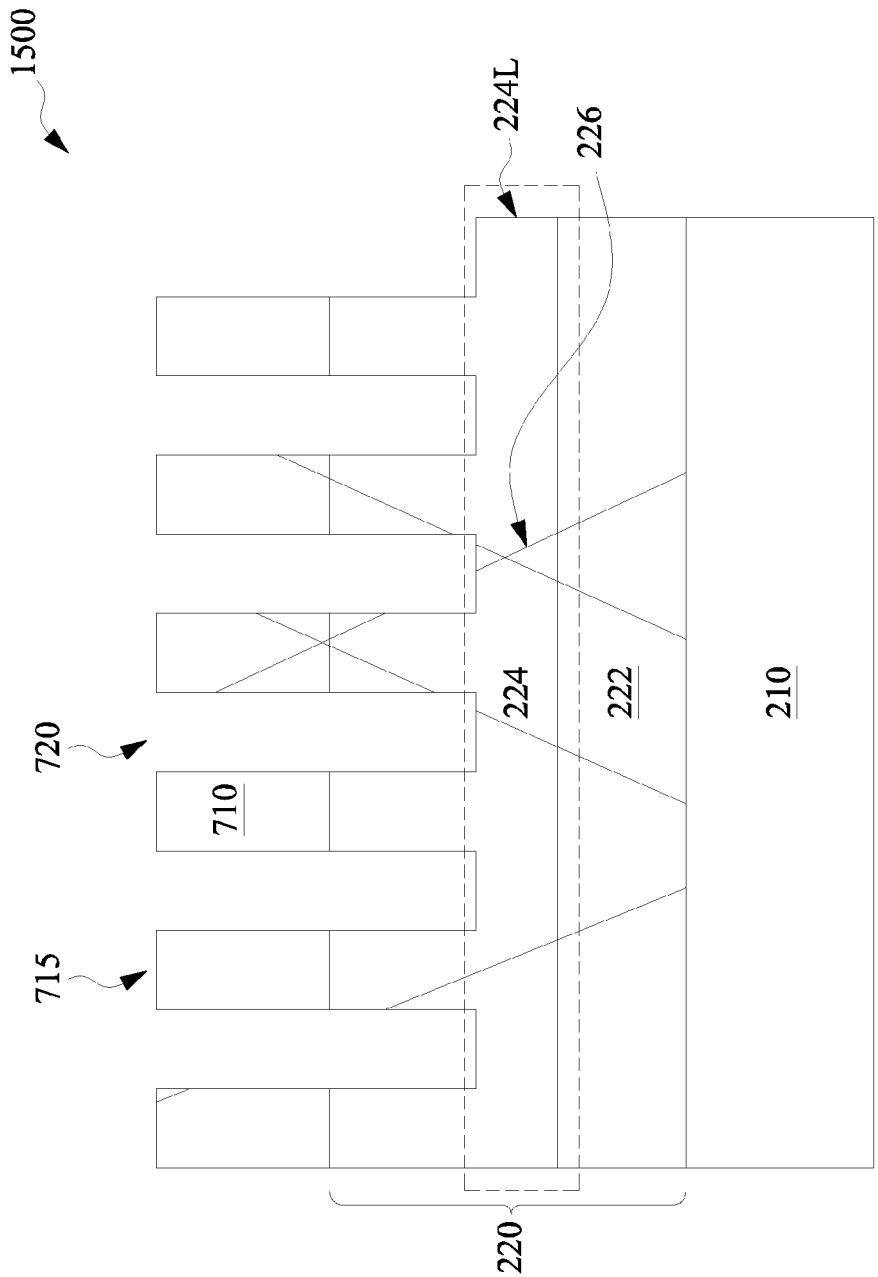

Referring to FIGS. 9 and 10, the method 1000 proceeds to step 1004 by depositing a third semiconductor material layer 710 over the first SRB stack 220. Various active regions may be formed by respective portions of the third semiconductor material layer 710, such as a gate and source/drains. In the present embodiment, the third semiconductor material layer 710 is different from the first semiconductor material of the substrate 210 with lattice constant mismatch for strained effect and enhanced mobility. The third semiconductor material layer 710 includes III-V group compound semiconductor, such as InAs, InGaAs, GaSb, InSb, or other suitable material. The third semiconductor material layer 710 is chosen to have a lower melt-temperature than a melt-temperature of the first SRB stack 220. In some embodiments, the melt-temperature of the third semiconductor material layer 710 is about 20% or more lower than the melt-temperature of the first SRB stack 220. In one embodiment, the third semiconductor material layer 710 is GaSb having a melt-temperature at about 720° C. while the first buffer layer 224 in the first SRB stack 220 is InAlAs having a melt-temperature in a range of about 1100° C. to about 1600° C.

The third semiconductor layer 710 is formed similarly in many respects to the second semiconductor material layer 610 discussed above association with FIG. 7A. The defects 226 extend upward into the third semiconductor material layer 710.

Referring to FIGS. 9 and 10I, the method 1000 proceeds to step 1006 by forming a plurality of fin features 715 over the substrate 210. The fin features 715 are formed by etching the third semiconductor material layer 710 and an upper portion of the first buffer layer 224 to form third trenches 720. In some embodiment, the etching process is controlled such that the lower portion 224L of the first buffer layer 224 remains. The third trench 720 is formed similarly in many respects to the first trench 310 discussed above association with FIG. 3.

Figure 12:
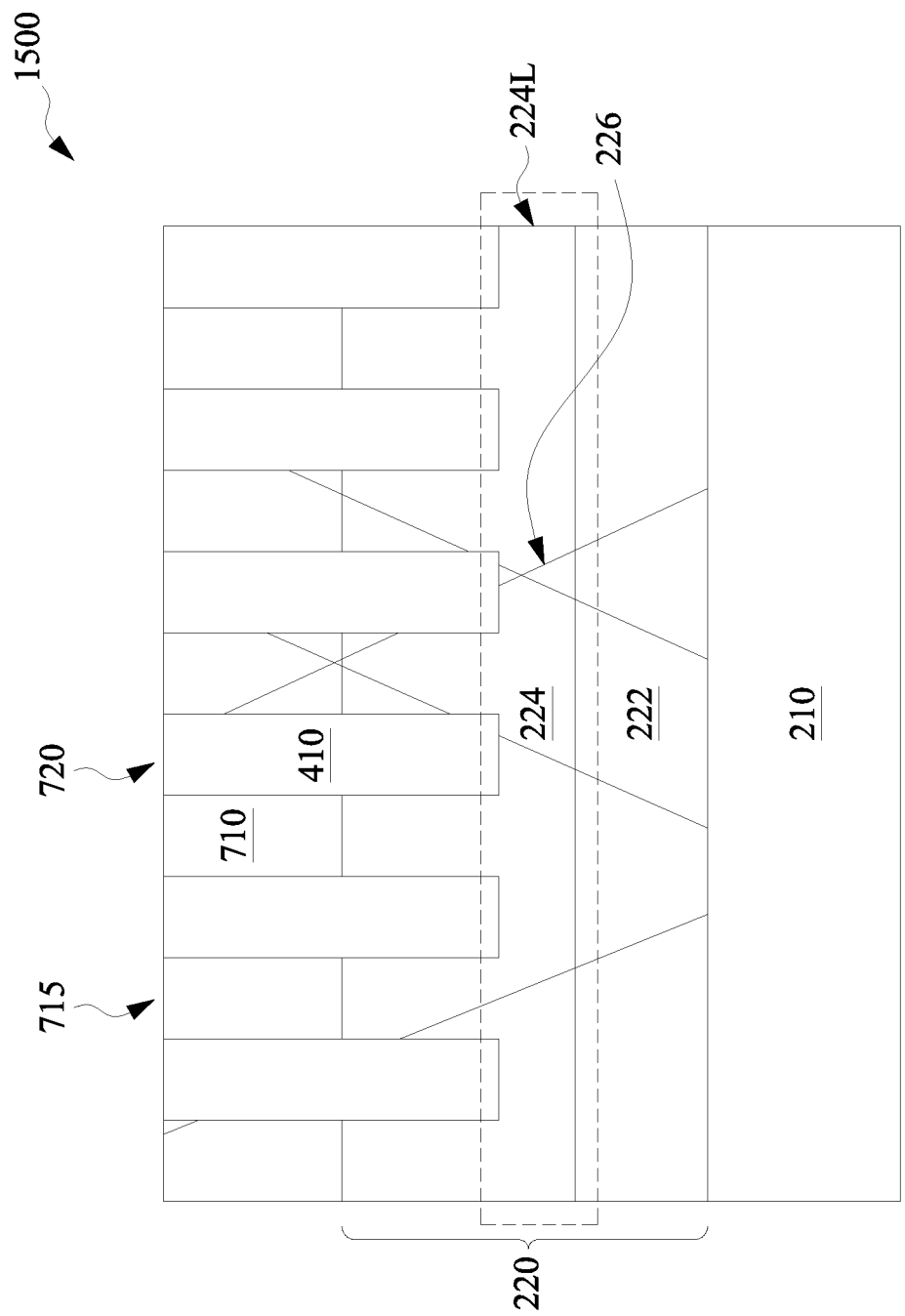

Referring to FIGS. 9 and 12, the method 1000 proceeds to step 1008 by filling in the third trench 720 with the dielectric layer 410. The third trench 720 is filled in similarly in many respects to filling in the first trench 310 discussed above association with FIG. 4.

Figure 13:
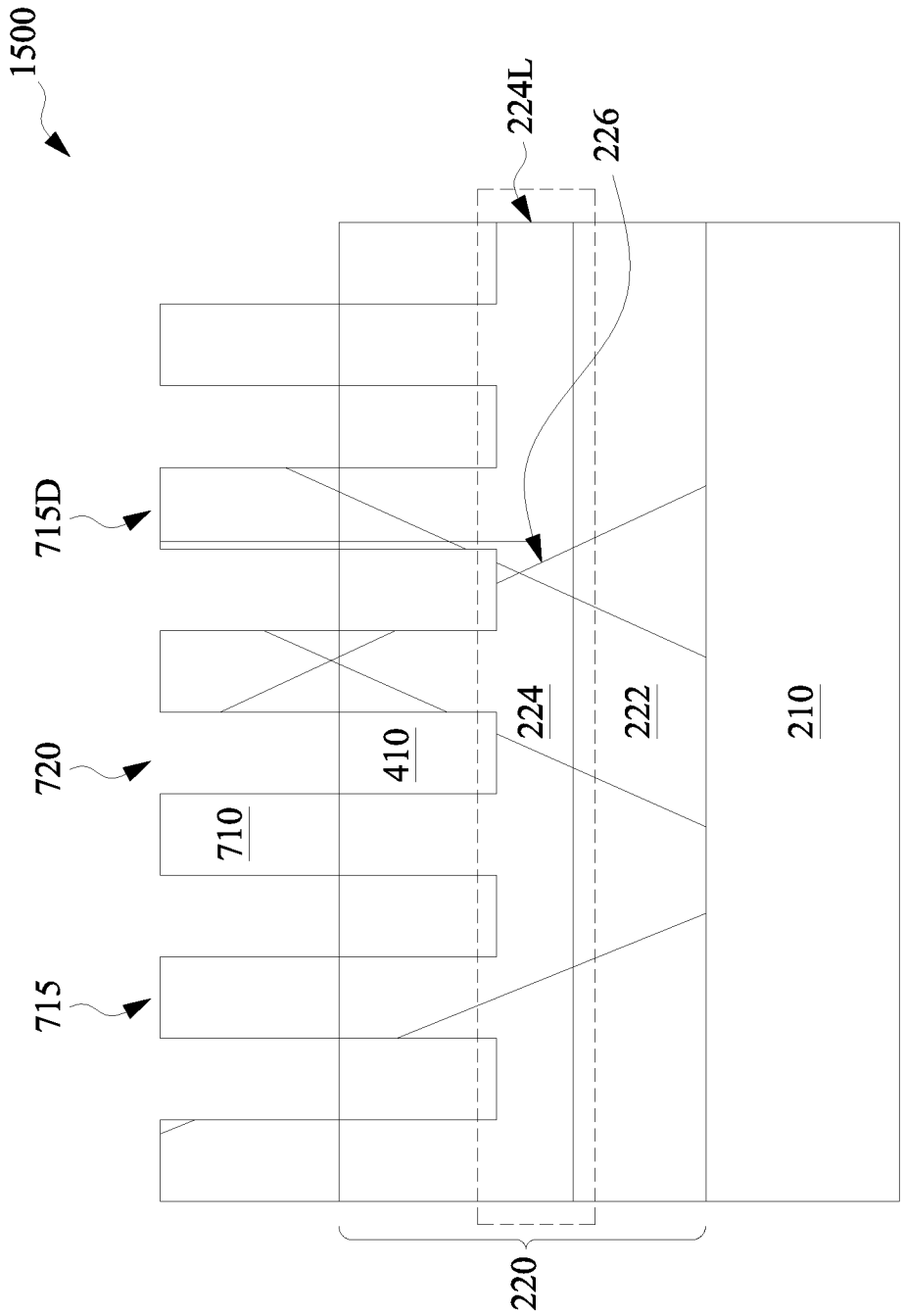

Referring to FIGS. 9 and 13, the method 1000 proceeds to step 1010 by recessing the dielectric layer 410 to expose the third semiconductor material layer 710 of the fin feature 715. The dielectric layer 410 is recessed by a wet etch, a dry etch, or a combination thereof. In some embodiments, the etch process is properly chosen to selectively etch the dielectric layer 410 without substantially etching the third semiconductor material layer 710. Some of fin features 715 have the defects 226, referred to as the fin feature 715D.

Figure 14:
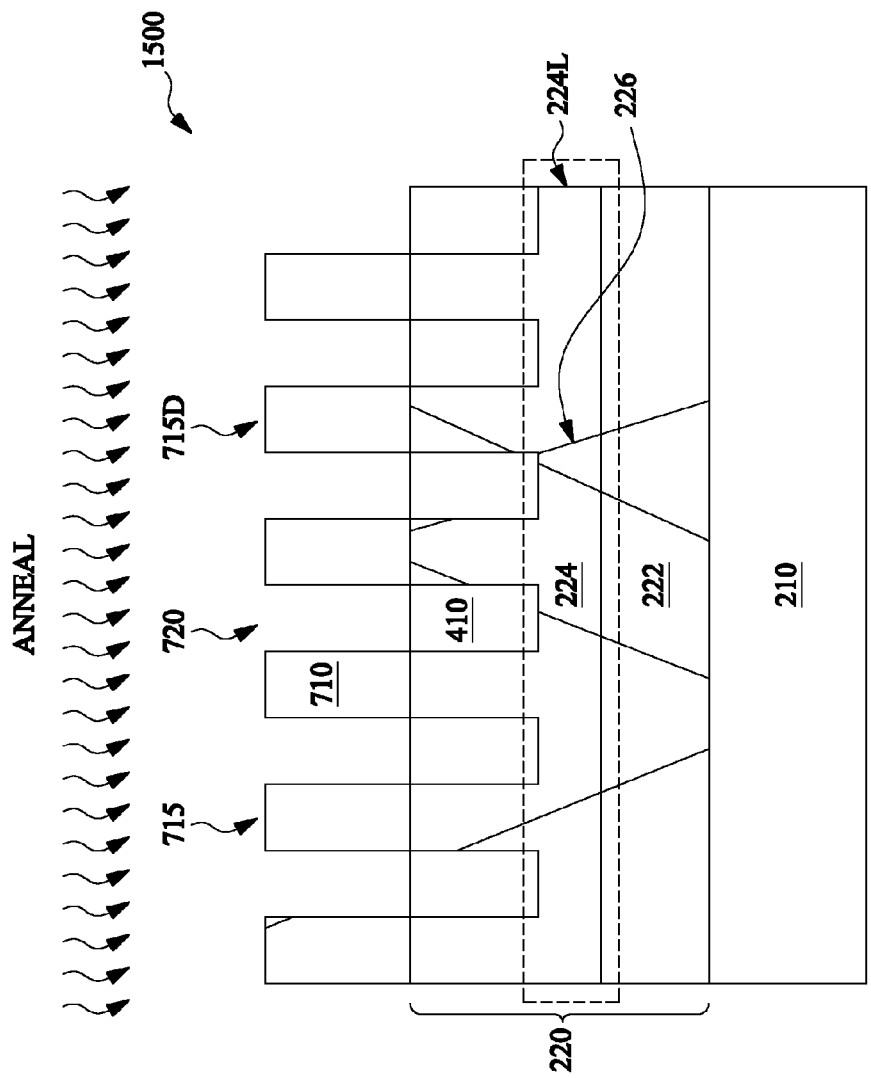

Referring to FIGS. 9 and 14, the method 1000 proceeds to step 1012 by performing an annealing process to cure/remove the defects 226 in the fin feature 715D. The defects 226 propagate through the fin feature 715D at elevated temperature and proper ambient of the annealing process. Thus the defects 226 are annealed out of the fin feature 715D. In some embodiments, the annealing process is conducted in a hydrogen ($H_2$) ambient environment. In some embodiments, the annealing process is conducted in a AsH3 ambient environment. The annealing process may be a rapid thermal anneal (RTA) or a millisecond thermal anneal (MSA), such as a millisecond laser thermal anneal. In one embodiment, the annealing process is implemented in a rapid thermal annealing (RTA) tool. As mentioned previously, the third semiconductor material layer 710 has a lower melt-temperature than the melt-temperature of the first SRB stack 220. In the present embodiment, a temperature of the annealing process is properly chosen to be below the melt-temperature of the third semiconductor material layer 710. As an example, the third semiconductor material layer 710 is InAs and the annealing process is performed in $AsH_3$ ambient environment at a temperature range from about 400° C. to 650° C.

Figure 15:
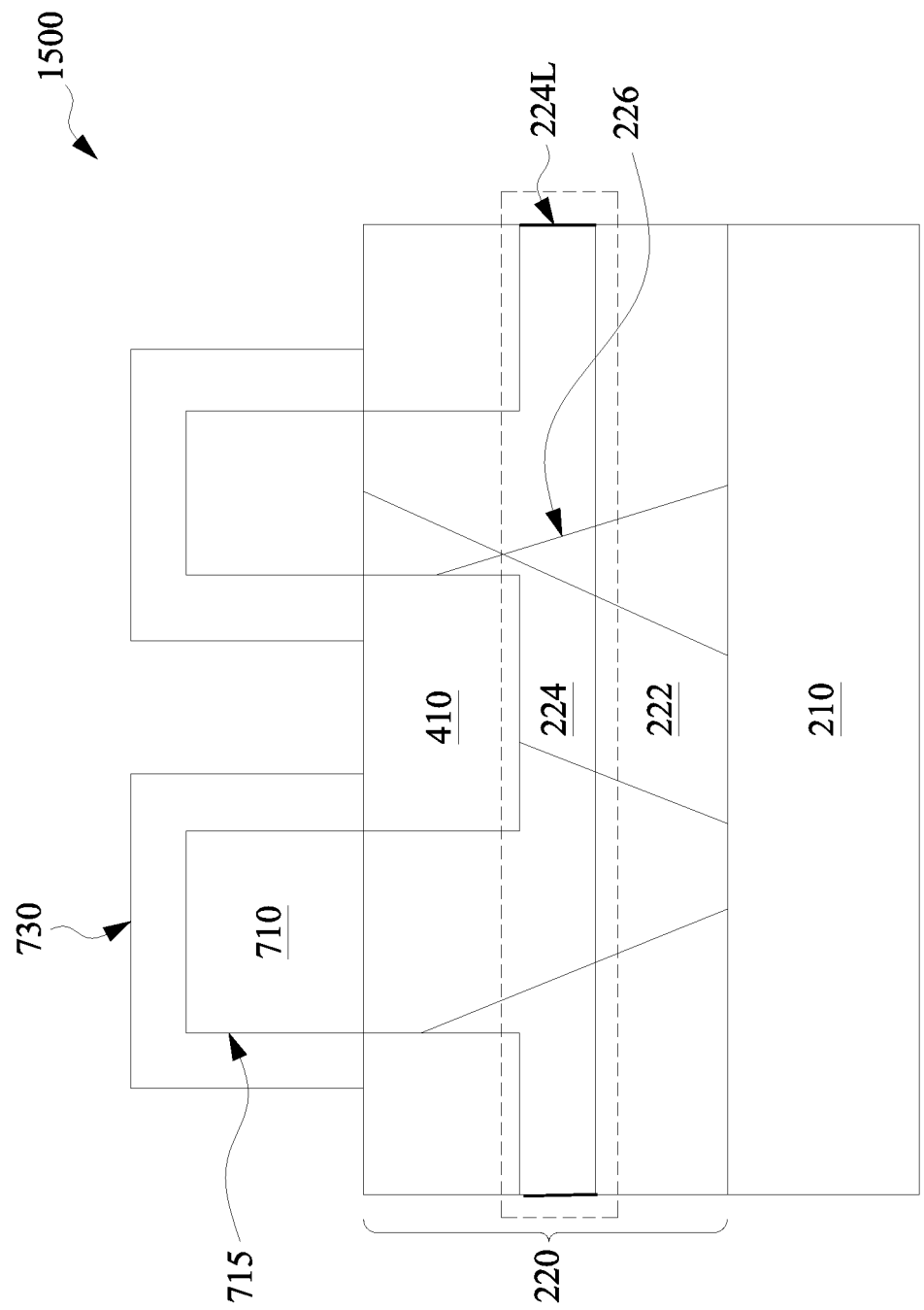

Additional steps can be provided before, during, and after the methods of 1000 and some of the steps described can be replaced, eliminated, or moved around for additional embodiments of the method of 1000. Other alternatives or embodiments may present without departure from the spirit and scope of the present disclosure. For example, after the defects 226 are moved from the fin feature 715D, high-k/metal gate (HK/MG) stacks 730 are formed over the substrate 210, including wrapping over the fin feature 715, as shown in FIG. 15.

Figure 16:
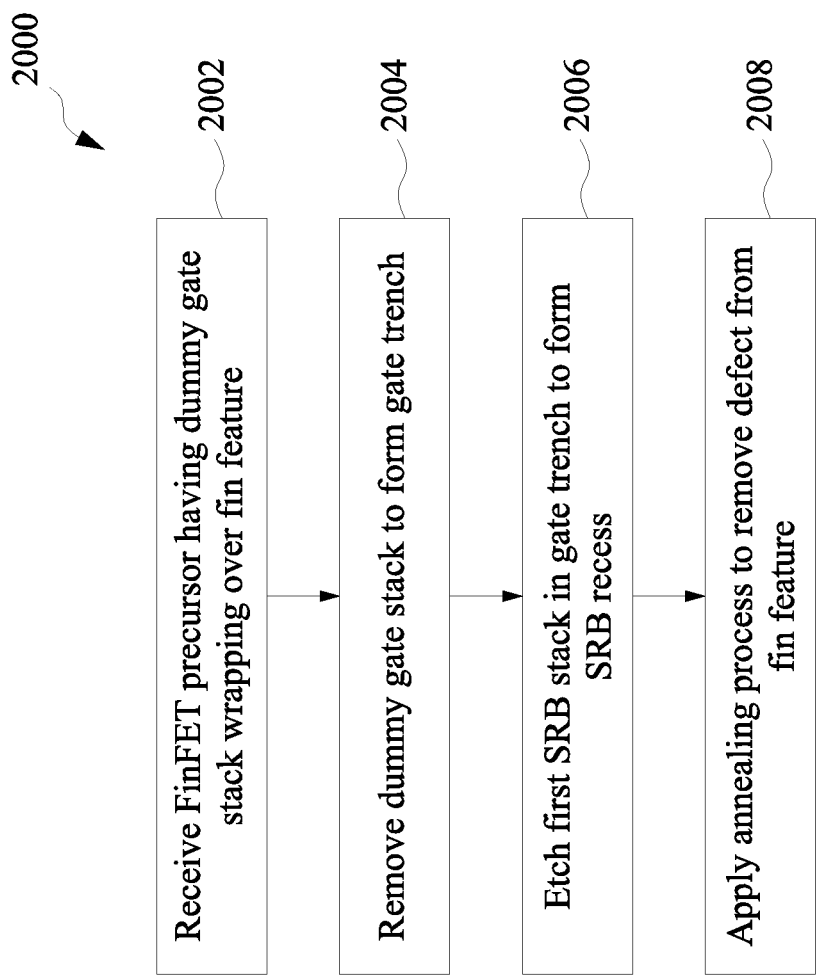
FIG. 16 is a flow chart of yet another example method for fabricating a semiconductor device in accordance with some embodiments.
Figure 17A:
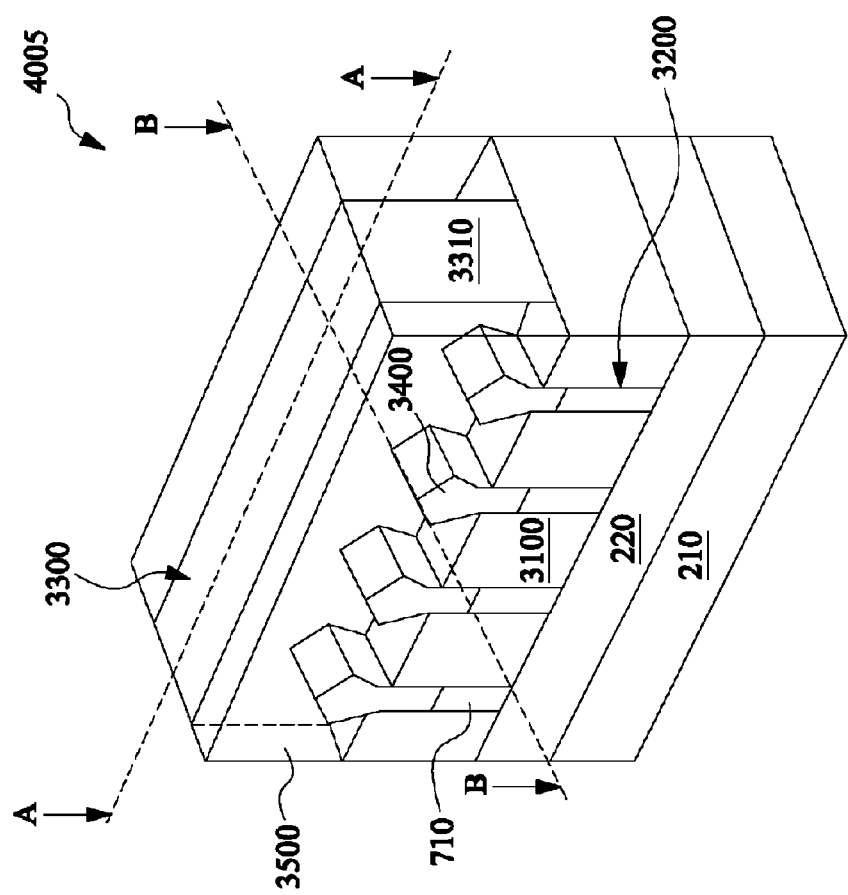
FIG. 17A is a top view of an example of a semiconductor device in accordance with some embodiments.

FIG. 16 is a flowchart of another example method 2000 for fabricating a semiconductor device 4100. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 16 and 17A-17C, the method 2000 begin at step 2002 by receiving a FinFET precursor 4005. The FinFET precursor 4005 includes the substrate 210 and the first SRB stack 220 formed over the substrate 210. The FinFET precursor 4005 may also include isolation regions 3100 formed on the substrate 210 to isolate active regions of the substrate 210. The isolation region 3100 may be formed using traditional isolation technology, such as shallow trench isolation (STI), to define and electrically isolate the various regions. The isolation region 3100 comprises silicon oxide, silicon nitride, silicon oxynitride, an air gap, other suitable materials, or combinations thereof.

The FinFET precursor 4005 includes fin features 3200 having the third semiconductor material layer 710 over the first SRB stack 220. The defects 226 propagate upward to the fin feature 3200. In the present embodiment, the third semiconductor material layer 710 is chosen to have a lower melt-temperature than a melt-temperature of the first SRB stack 220. The FinFET precursor 4005 also includes one or more dummy gate stacks 3300 formed over the substrate 210, including wrapping over a portion of the fins feature 3200. The dummy gate stacks 3300 are to be replaced later by a high-k (HK) and metal gate (MG). The dummy gate stack 3300 may include a polysilicon layer 3310. The dummy gate stack 3300 may be formed by a procedure including deposition, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching).

The FinFET precursor 4005 may also include source/drain features 3400 formed over the substrate 210. The source/drain features 3400 may be formed by recessing a portion of the fin feature 3200 and epitaxially growing a semiconductor material layer on the recessed fin feature 3200. The semiconductor material layer includes element semiconductor material such as germanium (Ge) or Si; or compound semiconductor materials, such as gallium arsenide (GaAs), aluminum gallium arsenide (AlGaAs); or semiconductor alloy, such as silicon germanium (SiGe), gallium arsenide phosphide (GaAsP).

The FinFET precursor 4005 may also include an interlayer dielectric (ILD) layer 3500 formed over the substrate 210, including between the dummy gate stacks 3300. The ILD layer 3500 includes silicon oxide, oxynitride or other suitable materials.

Referring to FIGS. 16 and 18A-18B, once the FinFET precursor 4005 is received, the method 2000 proceeds to step 2004 by removing the dummy gate stacks 3300 to form a gate trench 3600 and a respective portion of the fin feature 3200 is exposed in the gate trench 3600. The dummy gate stacks 3300 may be removed by lithography pattern and etch processes. Alternatively, the dummy gate stacks 3300 may be removed by a selective wet etch or a selective dry etch. A wet etching solution includes a TMAH, a $HF/HNO_3/CH_3COOH$ solution, $NH_4OH$, KOH, HF, or other suitable solution.

Figure 19B:
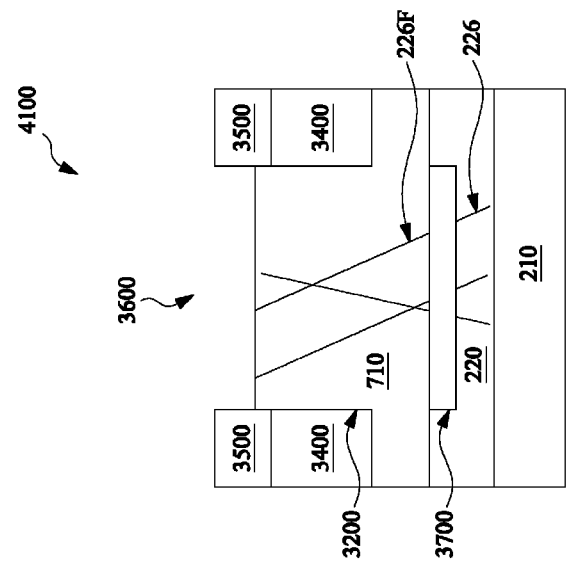
Figure 19A:
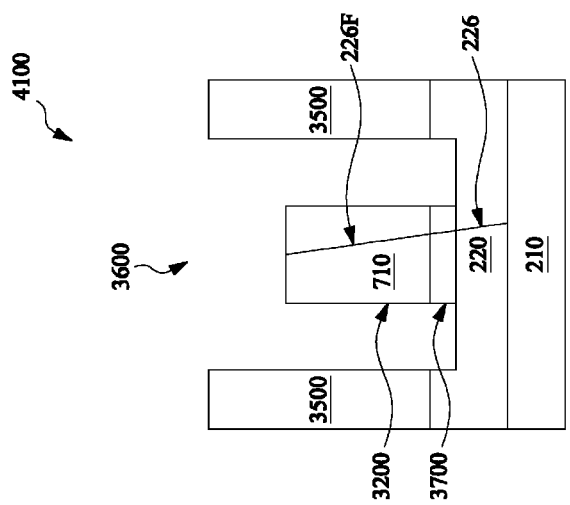

Referring to FIGS. 16 and 19A-19B, the method 2000 proceeds to step 2006 by etching the first SRB stack 220 in the gate trench 3600, including underneath the fin feature 3200, to form an SRB recess 3700 underneath the fin feature 3200. In some embodiments, the etch process is properly chosen to selectively etch the first SRB stack 220 without substantially etching the fin feature 3200 and the ILD layer 3500. The first SRB stack 220 may be etched by a selective wet etch, a selective dry etch, or/and a combination thereof. Therefore, in the gate trench 3600, the respective portion of the fin feature 3200 is spaced apart from the first SRB stack 220 by the SRB recess 3700. For the sake of clarity to better description, the defects 226 in the fin feature 3200 is referred to as 226F.

Figure 20B:
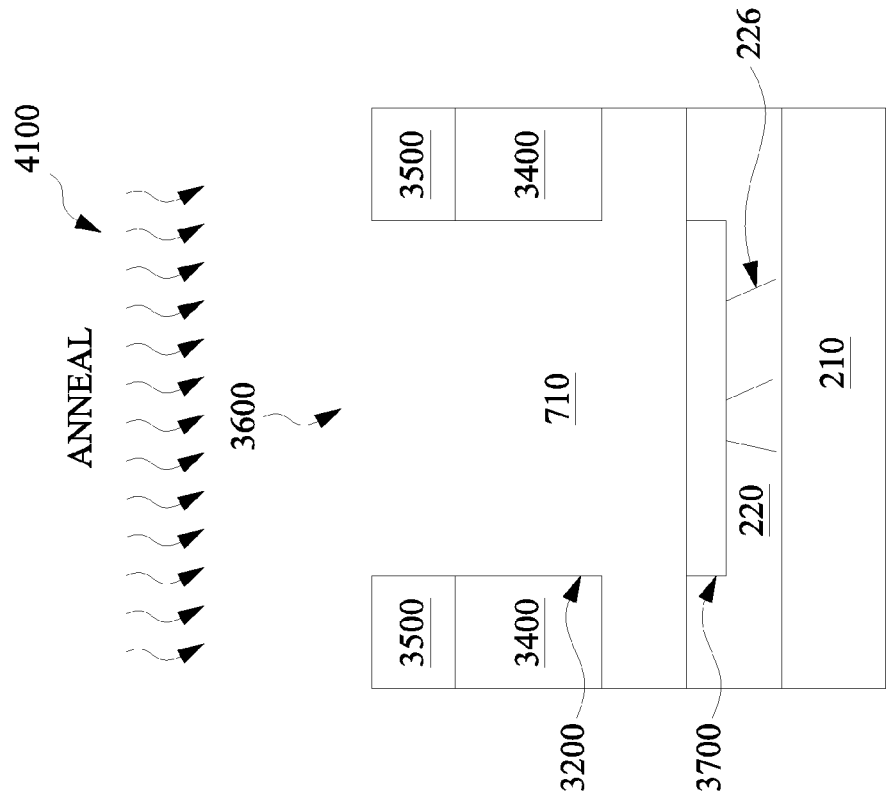
Figure 20A:
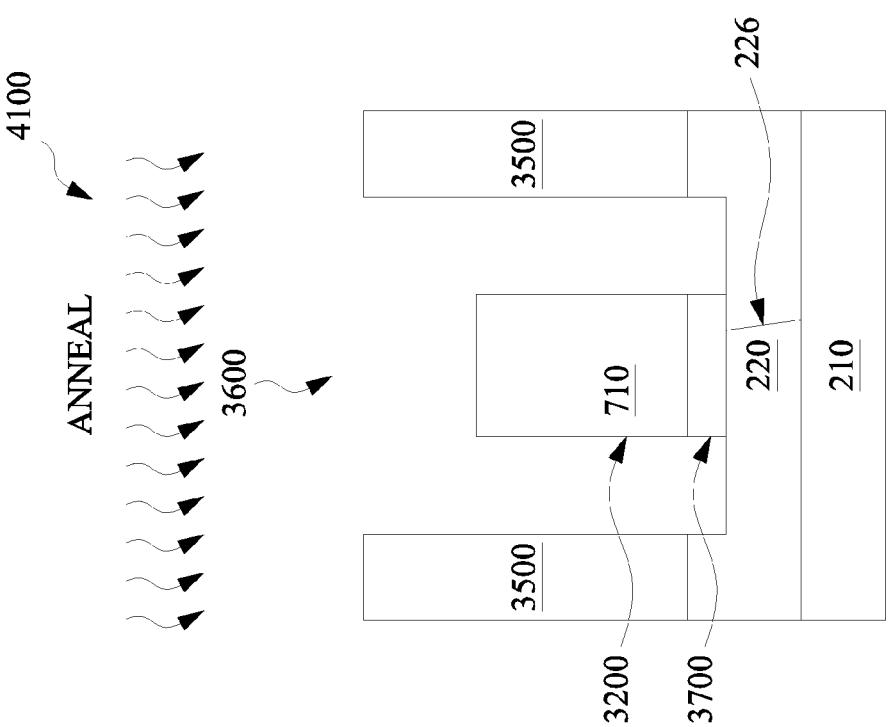

Referring to FIGS. 16 and 20A-20B, the method 2000 proceeds to step 2008 by performing an annealing process to cure/remove the defect 226F from the fin feature 3200. Thus the defects 226F are annealed out of the fin feature 3200. The SRB recess 3700 formed underneath the fin feature enhances efficiency of removing the threading dislocation defect from the fin feature 3200 in the gate trench 3600. The annealing process is performed similarly in many respects to the annealing process discussed above association with FIG. 14. In the present embodiment, a temperature of the annealing process is properly chosen to be below the melt-temperature of the third semiconductor material layer 710.

Figures 21A, 21B:
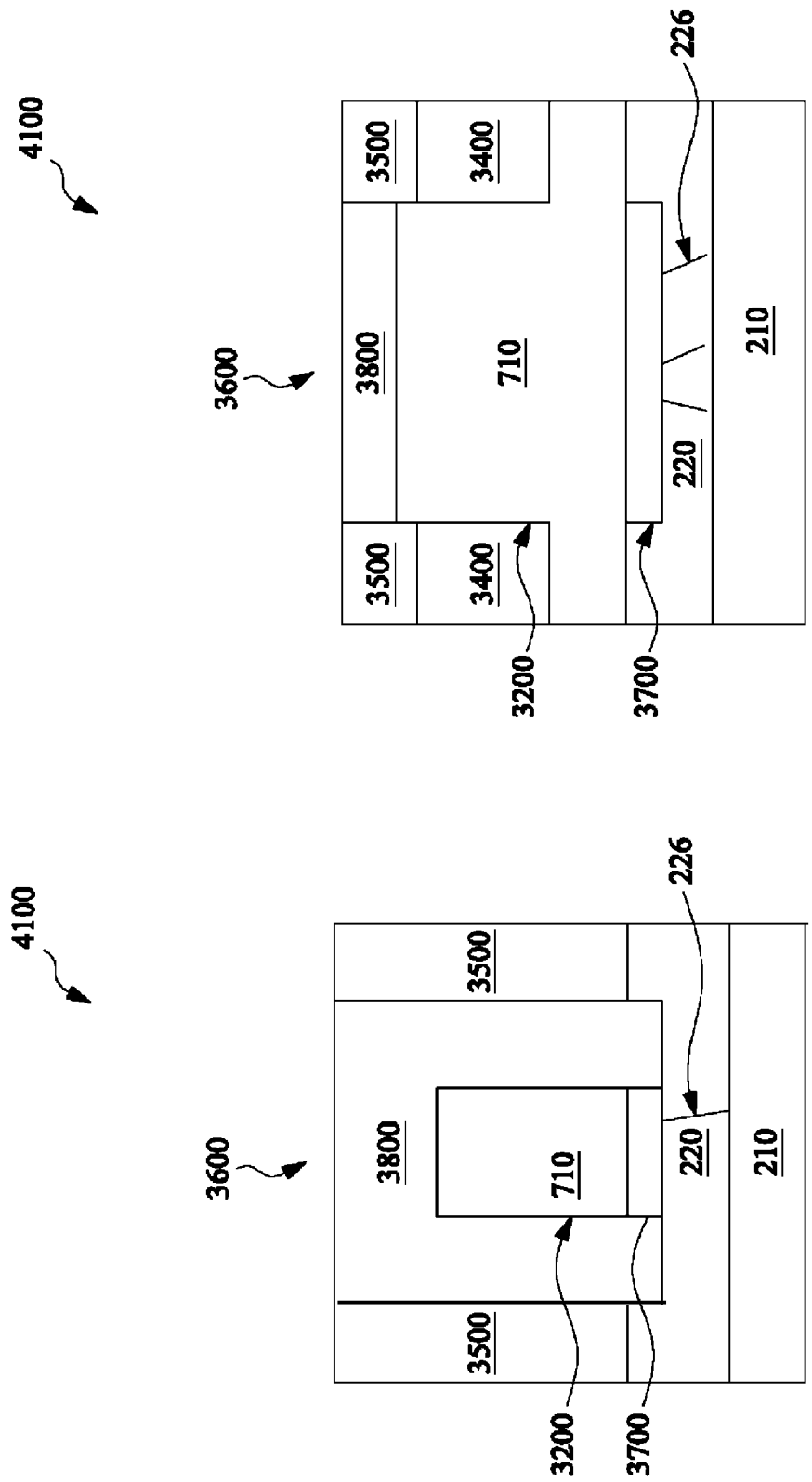

Additional steps can be provided before, during, and after the methods of 2000 and some of the steps described can be replaced, eliminated, or moved around for additional embodiments of the method of 2000. Other alternatives or embodiments may present without departure from the spirit and scope of the present disclosure. For example, after the defects 226F are moved, a high-k/metal gate (HK/MG) stacks 3800 are formed over the substrate 210, including wrapping over the fin feature 3200 in the gate trench 3600 to form an all-around-gate structure, as shown in FIGS. 21A-21B.

Based on the above, the present disclosure provides methods of removing threading dislocation defect from an upper portion of a substrate, where a fin feature of III-V group semiconductor material is to be formed over. The methods employ various techniques such as growing a second SRB stack over the first SRB stack within a dielectric trench, equipping a buffer layer in the first and second SRB stacks to enhance electric insulation, equipping a SLS layer in the second SRB stack to enhance trapping threading dislocation defect in a lower portion of the substrate. The disclosure also provides methods of applying annealing process to remove existing threading dislocation defect from a fin feature of III-V group semiconductor material. The methods also employ forming a SRB trench underneath the fin feature to enhance efficiency of removing the threading dislocation defect from the fin feature.

The present disclosure provides a method for fabricating a semiconductor device. The method includes forming a first strain-relaxed buffer (SRB) stack over a substrate. The first SRB stack has a lattice mismatch with respect to the substrate that generates a threading dislocation defect feature in the first SRB stack. The method also includes forming a patterned dielectric layer over the first SRB stack. The patterned dielectric layer includes a trench extending therethrough. The method also includes forming a second SRB stack over the first SRB stack and within the trench. The second SRB stack has a lattice mismatch with respect to the substrate such that an upper portion of the second SRB stack is without threading dislocation defects.

In another embodiment, a method includes forming a strain-relaxed buffer (SRB) stack over a substrate. The SRB stack has a lattice mismatch with the substrate that generates threading dislocation defect feature in the SRB stack. The method also includes forming a semiconductor material layer over the SRB stack. The semiconductor material layer has a lattice mismatch with the substrate and has the threading dislocation defect feature. The semiconductor material layer has a lower melt-temperature than a melt-temperature of the SRB stack. The method also includes forming fin features such that the semiconductor material layer is an upper portion of the fin feature and the SRB stack is a lower portion of the fin feature and performing an annealing process to remove the threading dislocation defect feature from the semiconductor material layer. A temperature of the annealing process is below the melt-temperature of the semiconductor material layer.

In yet another embodiment, a method includes forming a strain-relaxed buffer (SRB) stack over a substrate. The SRB stack has a lattice mismatch with the substrate that generates threading dislocation defect feature in the SRB stack. The method also includes forming a fin feature of a semiconductor material layer over the SRB stack. The semiconductor material layer has the threading dislocation defect feature. The method also includes removing a portion of the SRB stack underneath the fin feature to form a SRB recess and performing an annealing process to the fin feature having the SRB recess underneath of it, to remove the threading dislocation defects from the fin feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first strain-relaxed buffer (SRB) stack over a substrate, wherein the first SRB stack has a lattice mismatch with respect to the substrate that generates a threading dislocation defect feature in the first SRB stack;
forming a patterned dielectric layer over the first SRB stack, wherein the patterned dielectric layer includes a trench extending therethrough; and
forming a second SRB stack over the first SRB stack and within the trench, wherein the second SRB stack has a lattice mismatch with respect to the substrate such that an upper portion of the second SRB stack is without threading dislocation defects.

2. The method of claim 1, further comprising:
epitaxial depositing a semiconductor material layer over the second SRB stack within the trenches, wherein the semiconductor material layer has a lattice constant matching the second SRB stack, wherein the semiconductor material layer is without threading dislocation defects.

3. The method of claim 1, wherein the threading dislocation defect feature extends into a lower portion of the second SRB stack.

4. The method of claim 1, wherein forming the first SRB stack over the substrate comprising:
epitaxially depositing a SRB layer over the substrate; and
epitaxially depositing a first buffer layer over the SRB layer, wherein the first buffer layer has a larger band-gap comparing with respect to the SRB layer.

5. The method of claim 4, wherein the second SRB stack is formed over the first buffer layer, wherein the second SRB stack has a similar band-gap as the first buffer layer.

6. The method of claim 1, wherein forming the second SRB stack over the first SRB stack and within the trench includes forming a strained-layer-superlattice (SLS) layer over the first SRB stack, wherein the SLS layer is free of any threading dislocation defect features.

7. The method of claim 1, wherein forming the second SRB stack over the first SRB stack and within the trench includes forming a second buffer layer over the first SRB stack, wherein the defect feature extends into a lower portion of the second buffer layer while an upper portion of the second buffer is free of any threading dislocation defect features.

8. The method of claim 1, wherein forming the second SRB stack over the first SRB stack and within the trench includes:
forming a second buffer layer over the first SRB stack, wherein the defect feature extends into a lower portion of the second buffer layer while an upper portion of the second buffer is free of any threading dislocation defect features; and
forming a strained-layer-superlattice (SLS) layer over the second buffer layer, wherein the SLS layer is free of any threading dislocation defect features.

9. The method of claim 1, wherein forming a patterned dielectric layer over the first SRB stack includes:
etching the first SRB stack to form SRB trenches;
filling in the SRB trenches with the dielectric layer; and
removing an upper portion of the first SRB stack.

10. The method of claim 1, wherein:
the substrate includes silicon;
the first and second SRB stacks include III-V group compound semiconductor; and
the semiconductor material layer includes III-V group compound semiconductor.

11. A method comprising:
forming a strain-relaxed buffer (SRB) stack over a substrate, wherein the SRB stack has a lattice mismatch with the substrate that generates threading dislocation defect feature in the SRB stack;
forming a semiconductor material layer over the SRB stack, wherein the semiconductor material layer has a lattice mismatch with the substrate and has the threading dislocation defect feature, wherein the semiconductor material layer has a lower melt-temperature than a melt-temperature of the SRB stack;
forming fin features such that the semiconductor material layer is an upper portion of the fin feature and the SRB stack is a lower portion of the fin feature; and
performing an annealing process to remove the threading dislocation defect feature from the semiconductor material layer, wherein a temperature of the annealing process is below the melt-temperature of the semiconductor material layer.

12. The method of claim 11, wherein forming the SRB stack over the substrate comprising:
epitaxially depositing a SRB layer over the substrate; and
epitaxially depositing a buffer layer over the SRB layer, wherein the buffer layer has a larger band-gap comparing with the SRB layer.

13. The method of claim 11, further comprising:
prior to performing the annealing process, depositing a dielectric layer to fill in a space between each of fin features; and
recessing the dielectric layer to expose the semiconductor material layer of the fin feature.

14. The method of claim 11, wherein:
the substrate includes silicon;
the SRB stacks include III-V group compound semiconductor; and
the semiconductor material layer includes III-V group compound semiconductor.

15. A method comprising:
forming a strain-relaxed buffer (SRB) stack over a substrate, wherein the SRB stack has a lattice mismatch with the substrate that generates threading dislocation defect feature in the SRB stack;
forming a fin feature of a semiconductor material layer over the SRB stack, wherein the semiconductor material layer has the threading dislocation defect feature;
removing a portion of the SRB stack underneath the fin feature to form a SRB recess; and
performing an annealing process to the fin feature having the SRB recess underneath of it, to remove the threading dislocation defects from the fin feature.

16. The method of claim 15, wherein:
the substrate includes silicon;
the SRB stacks include III-V group compound semiconductor; and
the semiconductor material layer includes III-V group compound semiconductor.

17. The method of claim 15, further comprising:
after forming the fin feature of the semiconductor material layer over the SRB stack, forming a dummy gate stack over the substrate, including wrapping over a first portion of the fin feature;
forming source/drain features over a second portion of the fin feature beside the dummy gate stack; and
removing the dummy gate stack to form a gate trench, wherein the first portion of the fin feature is exposed in the gate trench.

18. The method of claim 17, wherein the SRB recess is formed underneath the exposed first portion of the fin feature in the gate trench.

19. The method of claim 17, wherein the annealing process remove the threading dislocation defect feature in the first portion of the fin feature.

20. The method of claim 15, wherein the respective portion of the fin feature is spaced apart from the SRB stack by the SRB recess during the annealing process.

* * * * *